(12) United States Patent
Hughes et al.

(10) Patent No.: US 11,706,062 B1
(45) Date of Patent: Jul. 18, 2023

(54) DIGITAL FILTER

(71) Applicant: Dialog Semiconductor B.V., s-Hertogenbosch (NL)

(72) Inventors: Ashley Hughes, Edinburgh (GB); Wessel Harm Lubberhuizen, Delden (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 17/534,698

(22) Filed: Nov. 24, 2021

(51) Int. Cl.
*H04L 25/49* (2006.01)
*H03M 3/00* (2006.01)

(52) U.S. Cl.
CPC .......... *H04L 25/4927* (2013.01); *H03M 3/43* (2013.01); *H03F 2200/345* (2013.01)

(58) Field of Classification Search
CPC ....... H03L 7/1976; H03L 7/093; H03L 7/099; H03L 7/0891; H03L 7/18; H03L 2207/50; H03L 7/085; H03L 7/1974; H03L 7/087; H04B 7/00; H04B 1/04; H04B 17/11; H04B 17/21; H03G 3/3068; H03G 3/3078; H03G 3/3089; H03G 1/0088; H03G 3/3042; H03G 3/30; H03G 3/3052; H03G 7/001; H03G 3/001
USPC .......................................................... 375/262
See application file for complete search history.

(56) References Cited

U.S. PATENT DOCUMENTS

| | | | |
|---|---|---|---|
| 3,793,513 A | 2/1974 | Kaneko | |
| 4,752,903 A * | 6/1988 | Iwata | H04B 3/23 |
| | | | 708/322 |
| 5,262,972 A | 11/1993 | Holden et al. | |
| 5,301,134 A | 4/1994 | Maruyama | |
| 5,305,307 A | 4/1994 | Chu | |
| 5,757,299 A | 5/1998 | Noro | |
| 5,757,862 A | 5/1998 | Ishizu | |

(Continued)

FOREIGN PATENT DOCUMENTS

| | | |
|---|---|---|
| EP | 2 860 874 | 12/2016 |
| GB | 2541977 | 3/2017 |
| WO | 2017/190976 | 11/2017 |

OTHER PUBLICATIONS

D.A. Johns et al., "Sigma-delta based IIR filters," [1991] Proceedings of the 34th Midwest Symposium on Circuits and Systems, Monterey, CA, USA, May 1992, pp. 210-213, vol. 1.

(Continued)

*Primary Examiner* — Eva Y Puente
(74) *Attorney, Agent, or Firm* — Saile Ackerman LLC; Stephen B. Ackerman

(57) ABSTRACT

A digital filter for filtering a pulse density modulation (PDM) signal is presented. The filter has a first filter circuit to receive an input signal and to provide a filtered input signal at successive time steps which include a first filtered value at the first time step and a second filtered value at a second time step. The filter also has a quantizer to provide an output signal comprising output values at successive time steps and a filter variable circuit with a first multiplication circuit to receive the first filter variable, and divide the first filter variable by a first gain factor and a first summing circuit configured to receive the divided first filter variable, receive the output signal, and add the divided first filter variable and the first output value and a second multiplication circuit and a delay circuit.

20 Claims, 15 Drawing Sheets

(56) References Cited

U.S. PATENT DOCUMENTS

| | | | |
|---|---|---|---|
| 5,784,378 A | 7/1998 | Murray | |
| 5,805,479 A | 9/1998 | Tang | |
| 5,904,731 A | 5/1999 | Matsui | |
| 5,946,650 A | 8/1999 | Wei | |
| 7,058,190 B1 | 6/2006 | Zakarauskas | |
| 7,061,415 B2 * | 6/2006 | Magrath | H03F 3/217 341/143 |
| 7,636,747 B2 | 12/2009 | Watanabe | |
| 7,652,604 B2 | 1/2010 | Parayandeh et al. | |
| 7,696,913 B2 | 4/2010 | Melanson | |
| 7,756,222 B2 | 7/2010 | Chen et al. | |
| 8,467,483 B2 | 6/2013 | Vishakhadatta | |
| 8,644,523 B2 | 2/2014 | Clemow | |
| 8,737,636 B2 | 5/2014 | Park et al. | |
| 8,761,867 B2 * | 6/2014 | Mascarenhas | H04B 15/005 600/509 |
| 8,896,738 B2 | 11/2014 | Sato et al. | |
| 9,053,697 B2 | 6/2015 | Park et al. | |
| 9,065,471 B1 | 6/2015 | Okuda | |
| 9,209,828 B2 | 12/2015 | Schubert et al. | |
| 9,361,872 B2 | 6/2016 | Park et al. | |
| 9,584,146 B2 | 2/2017 | Op 't Eynde et al. | |
| 9,644,561 B2 | 5/2017 | Magner | |
| 9,659,558 B2 | 5/2017 | Park et al. | |
| 9,857,921 B2 | 1/2018 | Pant | |
| 10,236,905 B1 | 3/2019 | Callanan et al. | |
| 10,784,890 B1 | 9/2020 | Hughes et al. | |
| 10,848,174 B1 | 11/2020 | Hughes et al. | |
| 10,861,433 B1 * | 12/2020 | Hughes | G10K 11/1785 |
| 10,951,229 B1 | 3/2021 | Hughes et al. | |
| 10,972,123 B1 | 4/2021 | Hughes et al. | |
| 11,107,453 B2 | 8/2021 | Hughes et al. | |
| 2005/0008071 A1 | 1/2005 | Bose et al. | |
| 2005/0053227 A1 | 3/2005 | Fortier | |
| 2007/0188218 A1 | 8/2007 | Ueda | |
| 2007/0273446 A1 | 11/2007 | Kim | |
| 2007/0285160 A1 | 12/2007 | Kim | |
| 2008/0104158 A1 * | 5/2008 | Farhoodfar | H03H 21/0027 708/405 |
| 2008/0225168 A1 | 9/2008 | Ouslis | |
| 2008/0250093 A1 | 10/2008 | Zhu | |
| 2010/0318204 A1 | 12/2010 | Ohkuri | |
| 2011/0007907 A1 | 1/2011 | Park et al. | |
| 2012/0148074 A1 | 6/2012 | Bastiaens | |
| 2014/0112492 A1 | 4/2014 | Clemow | |
| 2014/0125504 A1 | 5/2014 | Braswell | |
| 2014/0333462 A1 | 11/2014 | Breems | |
| 2016/0173112 A1 | 6/2016 | Das | |
| 2022/0149864 A1 * | 5/2022 | Prakash | H03M 3/32 |

OTHER PUBLICATIONS

D. A. Johns et al., "Design and analysis of delta-sigma based IIR filters," IEEE Transactions on Circuits and Systems II: Analog and Digital Signal, Processing, vol. 40, Issue: 4, Apr. 1993, pp. 233-240.

D. A. Johns et al., "IIR filtering on sigma-delta modulated signals," Electronics Letters, Feb. 14, 1991, vol. 27, No. 4, pp. 307-308.

D. A. Johns, "Analog and Digital State-Space Adaptive IIR Filters", PhD Thesis, Mar. 1989, 153 pages.

D. A, Johns et al., "Adaptive Recursive State-Space Filters Using a Gradient-Based Algorithm," IEEE Transactions on Circuits and Systems, vol. 37, Issue: 6, Jun. 1990, pp. 673-684.

P. W. Wong et al., "FIR Filters with Sigma-Delta Modulation Encoding," IEEE Transactions on Acoustics, Speech, and Signal Processing, vol. 38, Issue: 6, Jun. 1990, pp. 979-990.

Horst Gether et al., A Perspective on digital ANC solutions in a low latency dominated world, EDN, Jun. 19, 2017, https://www.edn.com/design/analog/4458544/A-perspective-on-digital-ANC-solutions-in-a-low-latency-dominated-world.

M. A. Aldajani et al., "Stability analysis of an adaptive structure for sigma delta modulation," ICECS 2000. 7th IEEE International Conference on Electronics, Circuits and Systems (Cat. No.00EX445), Dec. 2000, pp. 129-132, vol. 1.

M. A. Aldajani et al., "Stability and Performance Analysis of an Adaptive Sigma-Delta Modulator," IEEE Transactions on Circuits and Systems II: Analog and Digital Signal Processing, vol. 48, No. 3, Mar. 2001, pp. 233-244.

Robert Bristow-Johnson, DSP Trick: Fixed-Point DC Blocking Filter With Noise-Shaping, dspGuru by lowegian International, Apr. 17, 2011, https://dspguru.com/dsp/tricks/fixed-point-do-blocking-filter-with-noise-shaping/, accessed on Apr. 18, 2019, 2 pages.

Richard G. Lyons, DSP Tricks: DC Removal, Embedded, Aug. 11, 2008, https://www.embedded.com/design/configurabie-systems/4007653/DSP-Tricks- DC-Removal, accessed on Apr. 18, 2019, pp. 1-5.

Richard G. Lyons, Understanding digital signal processing, Second Edition, Prentice Hall PTR, 2004, chapter 13, pp. 84-87.

Ali Grami, Introduction to Digital Communications, Elsevier, 2016, chapter 5, pp. 217-264.

A query on the non-uniform Quantization, Stack Exchange, 2017, https://dsp.stackexchange.com/questions/40137/a-query-on-the-non-uniform-quantization, accessed on Apr. 18, 2019.

Jon Dattorro, The Implementation of Recursive Digital Filters for High-Fidelity Audio, Journal of Audio Engineering Society, Nov. 1988, vol. 36, No. 11, pp. 851-878 and Letters to the Editor.

Thomas Kite, Understanding PDM Digital Audio, Audio Precision Inc., 2012, http://users.ece.utexas.edu/~bevans/courses/rtdsp/lectures/10 Data Conversion/AP Understanding PDM Digital Audio.pdr, accessed on Apr. 18, 2019, pp. 1-9.

Xilinx, CIC, Aug. 2007, https://www.mit.brne.hu/systems/files/oktatas/targyak/8498/CIC_ppt.pdf, accessed in Apr. 18, 2019, 45 pages.

Alan V. Oppenheim et al., "Discrete-Time Signal Processing", 2010 Pearson, p. 412.

US Notice of Allowance, U.S. Appl. No. 16/854,341, Applicant: Hughes et al., dated Nov. 9, 2020, 19 pages.

U.S. Notice of Allowance, U.S. Appl. No. 16/407,250, Applicant: Hughes et al., dated Jun. 2, 2020, 9 pages.

U.S. Notice of Allowance, U.S. Appl. No. 16/407,247, Applicant: Hughes et al., dated Jan. 8, 2020, 12 pages.

U.S. Notice of Allowance, U.S. Appl. No. 16/407,247, Applicant: Hughes et al., dated Jan. 17, 2020, 12 pages.

U.S. Notice of Allowance, U.S. Appl. No. 16/407,232, Applicant: Hughes et al., dated Nov. 2, 2020, 11 pages.

U.S. Notice of Allowance, U.S. Appl. No. 16/407,254, Applicant: Hughes et al., dated Jan. 21, 2020, 13 pages.

Co-pending U.S. Appl. No. 16/407,254, filed May 9, 2019, Ashley Hughes et al., "Digital Filter Structure," 23 pages.

U.S. Office Action, U.S. Appl. No. 16/407,250, Applicant: Hughes et al., dated Feb. 4, 2020, 14 pages.

U.S. Office Action, U.S. Appl. No. 16/407,254, Applicant: Hughes et al., dated Oct. 19, 2021, 7 pages.

U.S. Office Action, U.S. Appl. No. 16/407,232, Applicant: Hughes et al., dated Apr. 30, 2021, 34 pages.

U.S. Office Action, U.S. Appl. No. 16/407,232, Applicant: Hughes et al., dated Jun. 9, 2020, 25 pages.

Wikipedia, Super Audio CD, Graph / https://en.wikipedia.org/wiki/Pulse-code_modulation / CC BY-SA 3.0—Google S . . . found Jun. 12, 2019, pp. 1-4.

* cited by examiner

DIGITAL FILTER

RELATED PATENT APPLICATIONS

This application is related to U.S. Pat. No. 10,848,174, issued on Nov. 24, 2020, U.S. Pat. No. 10,951,229, issued on Mar. 16, 2021, U.S. Pat. No. 10,972,123, issued on Apr. 6, 2021, U.S. Pat. No. 10,861,433, issued on Dec. 8, 2020, application Ser. No. 16/407,254, filed on May 9, 2019, U.S. Pat. No. 11,107,453, issued on Aug. 31, 2021 and U.S. Pat. No. 10,784,890, issued on Sep. 22, 2020, all of which are assigned to a common assignee, and all of which are incorporated by reference in their entirety.

TECHNICAL FIELD

The present disclosure relates to the field of electronic circuits for digital filtering. In particular the present disclosure relates to a digital filter for filtering a pulse density modulation (PDM) signal.

BACKGROUND

A pulse-code modulated (PCM) signal encodes pulses of different heights at a constant frequency. A PCM signal is multi-bit and is typically at the Nyquist frequency. A pulse-density modulated (PDM) signal encodes pulses of the same height, hence it requires only one bit that can take any two values (usually represented as 0 and 1 or as 1 and −1); a PDM signal is a single-bit signal. Typically, a PDM signal will be lower resolution but with a higher sampling frequency than a PCM signal.

FIG. 1A (Graph/https://en.wikipedia.org/wiki/Pulse-code_modulation/CCBY-SA 3.0/redrawn and labelled) A shows an example of a PCM signal 100 and FIG. 1B shows an example of a PDM signal 102. Each of the signals 100, 102 are discrete time signals that may be represented by x[n], where n is a discrete time value. In each case the signals 100, 102 show conversion of a sine wave 103 to the respective formats. Each of the signals 100, 102 has a value at each of the discrete time values. For example, the PCM signal has a value of 8 at a discrete time value of 1, such that x[1]=8 (as shown at point 104 in the Figure), and the PDM signal 102 has a value of 1 at a discrete time value of 4, such that x[4]=1 (as shown at point 106 in the Figure).

Filtering of a digital signal using a digital filter is typically performed on PCM format digital data, however in some applications where the data must be down sampled and converted to PCM before filtering (for example, from a PDM signal), it is desirable to directly filter the digital signal without conversion to PCM.

Delays are incurred when a Pulse-Density Modulated (PDM) signal is converted to PCM. Further delays are also incurred when the PCM signal is converted back to PDM, as may be required by further blocks in the signal processing chain. Additionally, PDM signals are oversampled compared to the Nyquist frequency, so conversion to PCM will either require sample-rate conversion, or hardware multipliers capable of high data bit-width multiplication with filtering coefficients at a high clock speed.

SUMMARY

It is desirable to provide a digital filter that does not require sample-rate or data format conversions. Furthermore, it is desirable that the digital filter is area and power efficient when implemented in hardware.

According to a first aspect of the disclosure there is provided a digital filter comprising a) a first filter circuit configured to i) receive an input signal comprising input values at successive time steps which include a first input value at a first time step and a second input value at a second time step, and ii) provide a filtered input signal comprising filtered values at successive time steps which include a first filtered value at the first time step and a second filtered value at a second time step, the first filtered value being provided by applying a first filter variable to the first input value and the second filtered value being provided by applying a second filter variable to the second input value, b) a quantizer configured to provide an output signal comprising output values at successive time steps which include a first output value at the first time step and a second output value at the second time step, the output signal being provided by quantising the filtered input signal, and c) a filter variable circuit comprising i) a multiplication circuit configured to detect the output signal and to multiply the first output value by a first gain factor to provide a multiplied first output value, ii) a first summing circuit configured to receive the multiplied first output value and to add the multiplied first output value to the first filter variable, iii) a delay circuit configured to receive the sum of the multiplied first output value and the first filter variable and to provide the second filter variable to the first filter circuit, the second filter variable being equal to the sum of the multiplied first output value and the first filter variable, wherein the first filter variable and the second filter variable are representative of one or more frequency components to be attenuated in the input signal.

Optionally, the first filter circuit comprises a second summing circuit configured to receive the input signal, the first filter variable and the second filter variable, provide the first filtered value by subtracting the first filter variable from the first input value, and provide the second filtered value by subtracting the second filter variable from the second input value.

Optionally, the first gain factor is a power of two.

Optionally, the digital filter comprises a memory element for storing the first filter variable and/or the second filter variable.

Optionally, the first filter variable is a user defined value.

Optionally, the input signal comprises two or more levels of quantisation and/or the output signal comprises two or more levels of quantisation.

Optionally, the digital filter is configured as one of a high pass filter such that the frequency components to be attenuated in the input signal are low frequency components, a low pass filter such that the frequency components to be attenuated in the input signal are high frequency components, a band reject filter such that the frequency components to be attenuated in the input signal are over a finite frequency band, and a band pass filter such that the frequency components to be attenuated in the input signal are high and low frequency components either side of a frequency band to be passed.

Optionally, the digital filter comprises a sigma-delta modulator comprising the quantiser, the sigma-delta modulator being configured to receive the filtered input signal and to process the filtered input signal before and/or after being quantised by the quantiser.

Optionally, the digital filter comprises an attenuation circuit configured to attenuate the input signal prior to the filtered input signal being provided.

Optionally, the sigma-delta modulator is configured to apply a sigma-delta modulator gain to the filtered input signal in the generation of the output signal.

Optionally, the sigma-delta modulator is configured to i) receive an indicator signal that is representative of a magnitude of the input signal, and ii) adjust the sigma-delta modulator gain based on the indicator signal.

Optionally, the indicator signal is representative of the magnitude of the input signal in the audio band, where the audio band corresponds to frequencies being less than 24 kHz.

Optionally, the sigma-delta modulator is configured to receive the indicator signal from a second filter circuit that is configured to detect a first signal, the first signal being one of the input signal and the output signal, and provide the indicator signal to the sigma-delta modulator, wherein the indicator signal is dependent on the first signal.

Optionally, the digital filter comprises the second filter circuit.

Optionally, the second filter circuit is configured to run an algorithm to determine a suitable sigma-delta modulator gain based on the magnitude of the input signal at the one or more frequency components to be attenuated as estimated using the first signal, wherein the indicator signal is based on the sigma-delta modulator gain determined by the algorithm.

Optionally, the second filter circuit is a low pass filter, such that the indicator signal is a low passed first signal.

Optionally, the first filter variable and the second filter variable are an estimates of the one or more frequency components to be attenuated in the input signal.

According to a second aspect of the disclosure there is provided a method of digital filtering an input signal to provide an output signal, the method comprising receiving the input signal comprising input values at successive time steps which include a first input value at a first time step and a second input value at a second time step using a first filter circuit, providing a filtered input signal comprising filtered values at successive time steps which include a first filtered value at the first time step and a second filtered value at a second time step, the first filtered value being provided by applying a first filter variable to the first input value and the second filtered value being provided by applying a second filter variable to the second input value using the first filter circuit, providing an output signal comprising output values at successive time steps which include a first output value at the first time step and a second output value at the second time step, the output signal being provided by quantising the filtered input signal using a quantizer, detecting the output signal using a multiplication circuit, multiplying the first output value by a first gain factor to provide a multiplied first output value using the multiplication circuit, receiving the multiplied first output value using a first summing circuit, adding the multiplied first output value to the first filter variable using the first summing circuit, receiving, at a delay circuit, the sum of the multiplied first output value and the first filter variable, and providing the second filter variable to the first filter circuit using the delay circuit, the second filter variable being equal to the sum of the multiplied first output value and the first filter variable, wherein the first filter variable and the second filter variable are representative of one or more frequency components to be attenuated in the input signal.

Optionally, the first filter circuit comprises a second summing circuit, the method comprising receiving the input signal, the first filter variable and the second filter variable using the second summing circuit, providing the first filtered value by subtracting the first filter variable from the first input value using the second summing circuit, and providing the second filtered value by subtracting the second filter variable from the second input value using the second summing circuit.

Optionally, the first gain factor is a power of two.

Optionally, the method comprises storing the first filter variable and/or the second filter variable using a memory element.

It will be appreciated that the method of the second aspect may include providing and/or using features set out in the first aspect and can incorporate other features as described herein.

According to a third aspect of the disclosure there is provided a digital filter comprising a) a first filter circuit configured to i) receive an input signal comprising input values at successive time steps which include a first input value at a first time step and a second input value at a second time step, and ii) provide a filtered input signal comprising filtered values at successive time steps which include a first filtered value at the first time step and a second filtered value at a second time step, the first filtered value being provided by applying a first filter variable to the first input value and the second filtered value being provided by applying a second filter variable to the second input value, b) a quantizer configured to provide an output signal comprising output values at successive time steps which include a first output value at the first time step and a second output value at the second time step, the output signal being provided by quantising the filtered input signal, and c) a filter variable circuit configured to detect the output signal and to provide the second filter variable, the second filter variable being dependent on the first output value, d) a sigma-delta modulator comprising the quantiser, the sigma-delta modulator being configured to i) receive the filtered input signal and to process the filtered input signal before and/or after being quantised by the quantiser, ii) apply a sigma-delta modulator gain to the filtered input signal in the generation of the output signal, iii) receive an indicator signal that is representative of a magnitude of the input signal at the one or more frequency components to be attenuated, and iv) adjust the sigma-delta modulator gain based on the indicator signal, wherein the first filter variable and the second filter variable are representative of one or more frequency components to be attenuated in the input signal.

It will be appreciated that the digital filter of the third aspect may include providing and/or using features set out in the first aspect and can incorporate other features as described herein.

According to a fourth aspect of the present disclosure there is provided a method of digital filtering an input signal to provide an output signal, the method comprising receiving the input signal comprising input values at successive time steps which include a first input value at a first time step and a second input value at a second time step using a first filter circuit, providing a filtered input signal comprising filtered values at successive time steps which include a first filtered value at the first time step and a second filtered value at a second time step, the first filtered value being provided by applying a first filter variable to the first input value and the second filtered value being provided by applying a second filter variable to the second input value using the first filter circuit, providing the output signal comprising output values at successive time steps which include a first output value at the first time step and a second output value at the second time step, the output signal being provided by quantising the filtered input signal using a quantiser, and detecting the output signal and providing the second filter variable, the second filter variable being dependent on the first output value using a filter variable circuit, receiving the filtered input signal and processing the filtered input signal before and/or after being quantised by the quantiser using a sigma-delta modulator comprising the quantiser, applying a sigma-delta modulator gain to the filtered input signal in the generation of the output signal using the sigma-delta modulator, receiving an indicator signal that is representative of a magnitude of the input signal at the one or more frequency components to be attenuated using the sigma-delta modulator, and adjusting the sigma-delta modulator gain based on the indicator signal using the sigma-delta modulator, wherein the first filter variable and the second filter variable are representative of one or more frequency components to be attenuated in the input signal.

It will be appreciated that the digital filter of the fourth aspect may include providing and/or using features set out in the third aspect and can incorporate other features as described herein.

According to a fifth aspect of the disclosure there is provided a digital filter comprising a) a first filter circuit configured to i) receive an input signal comprising input values at successive time steps which include a first input value at a first time step and a second input value at a second time step, and ii) provide a filtered input signal comprising filtered values at successive time steps which include a first filtered value at the first time step and a second filtered value at a second time step, the first filtered value being provided by applying a first filter variable to the first input value and the second filtered value being provided by applying a second filter variable to the second input value, b) a quantizer configured to provide an output signal comprising output values at successive time steps which include a first output value at the first time step and a second output value at the second time step, the output signal being provided by quantising the filtered input signal, and c) a filter variable circuit comprising i) a first multiplication circuit configured to receive the first filter variable, and divide the first filter variable by a first gain factor, ii) a first summing circuit configured to receive the divided first filter variable, receive the output signal, and add the divided first filter variable and the first output value iii) a second multiplication circuit configured to receive the sum of the divided first filter variable and the first output value, and multiply the sum of the divided first filter variable and the first output value by the first gain factor, iv) a delay circuit configured to receive the sum of the divided first filter variable and the first output value multiplied by the first gain factor, and provide the second filter variable to the first filter circuit, the second filter variable being equal to the sum of the divided first filter variable and the first output value multiplied by the first gain factor, wherein the first filter variable and the second filter variable are representative of one or more frequency components to be attenuated in the input signal.

Optionally, the first filter circuit comprises a second summing circuit configured to receive the input signal, the first filter variable and the second filter variable, provide the first filtered value by subtracting the first filter variable from the first input value, and provide the second filtered value by subtracting the second filter variable from the second input value.

Optionally, the first gain factor is a power of two.

Optionally, the digital filter comprises a memory element for storing the first filter variable and/or the second filter variable.

Optionally, the first filter variable is a user defined value.

Optionally, the input signal comprises two or more levels of quantisation and/or the output signal comprises two or more levels of quantisation.

Optionally, the digital filter is configured as one of a high pass filter such that the frequency components to be attenuated in the input signal are low frequency components, a low pass filter such that the frequency components to be attenuated in the input signal are high frequency components, a band reject filter such that the frequency components to be attenuated in the input signal are over a finite frequency band, and a band pass filter such that the frequency components to be attenuated in the input signal are high and low frequency components either side of a frequency band to be passed.

Optionally, the digital filter comprises a sigma-delta modulator comprising the quantiser, the sigma-delta modulator being configured to receive the filtered input signal and to process the filtered input signal before and/or after being quantised by the quantiser.

Optionally, the digital filter comprises an attenuation circuit configured to attenuate the input signal prior to the filtered input signal being provided.

Optionally, the sigma-delta modulator is configured to apply a sigma-delta modulator gain to the filtered input signal in the generation of the output signal.

Optionally, the sigma-delta modulator is configured to i) receive an indicator signal that is representative of a magnitude of the input signal, and ii) adjust the sigma-delta modulator gain based on the indicator signal.

Optionally, the sigma-delta modulator is configured to receive the indicator signal from a second filter circuit that is configured to detect a first signal, the first signal being one of the input signal and the output signal, and provide the indicator signal to the sigma-delta modulator, wherein the indicator signal is dependent on the first signal.

Optionally, the digital filter comprises the second filter circuit.

Optionally, the second filter circuit is configured to run an algorithm to determine a suitable sigma-delta modulator gain based on the magnitude of the input signal at the one or more frequency components to be attenuated as estimated using the first signal, wherein the indicator signal is based on the sigma-delta modulator gain determined by the algorithm.

Optionally, the second filter circuit is a low pass filter, such that the indicator signal is a low passed first signal.

Optionally, the first filter variable and the second filter variable are an estimates of the one or more frequency components to be attenuated in the input signal.

It will be appreciated that the digital filter of the fifth aspect may include providing and/or using features set out in the first, second, third and/or fourth aspects and can incorporate other features as described herein.

According to a sixth aspect of the disclosure there is provided a method of digital filtering an input signal to provide an output signal, the method comprising receiving the input signal comprising input values at successive time steps which include a first input value at a first time step and a second input value at a second time step using a first filter circuit, providing a filtered input signal comprising filtered values at successive time steps which include a first filtered value at the first time step and a second filtered value at a second time step, the first filtered value being provided by applying a first filter variable to the first input value and the second filtered value being provided by applying a second filter variable to the second input value using the first filter circuit, providing an output signal comprising output values at successive time steps which include a first output value at the first time step and a second output value at the second time step, the output signal being provided by quantising the filtered input signal using a quantizer, receiving the first filter variable using a first multiplication circuit, dividing the first filter variable by a first gain factor using the first multiplication circuit, receiving the divided first filter variable using a first summing circuit, receiving the output signal using the first summing circuit, adding the divided first filter variable and the first output value using the first summing circuit, receiving the sum of the divided first filter variable and the first output value using a second multiplication circuit, multiplying the sum of the divided first filter variable and the first output value by the first gain factor using the second multiplication circuit, receiving the sum of the divided first filter variable and the first output value multiplied by the first gain factor using a delay circuit, and providing the second filter variable to the first filter circuit using the delay circuit, the second filter variable being equal to the sum of the divided first filter variable and the first output value multiplied by the first gain factor, wherein the first filter variable and the second filter variable are representative of one or more frequency components to be attenuated in the input signal.

Optionally, the first filter circuit comprises a second summing circuit, the method comprising receiving the input signal, the first filter variable and the second filter variable using the second summing circuit, providing the first filtered value by subtracting the first filter variable from the first input value using the second summing circuit, and providing the second filtered value by subtracting the second filter variable from the second input value using the second summing circuit.

Optionally, the first gain factor is a power of two.

Optionally, the method comprises storing the first filter variable and/or the second filter variable using a memory element.

It will be appreciated that the method of the sixth aspect may include providing and/or using features set out in the fifth aspect and can incorporate other features as described herein.

BRIEF DESCRIPTION of the DRAWINGS

The disclosure is described in further detail below by way of example and with reference to the accompanying drawings, in which.

DESCRIPTION

Figures 1A, 1B:
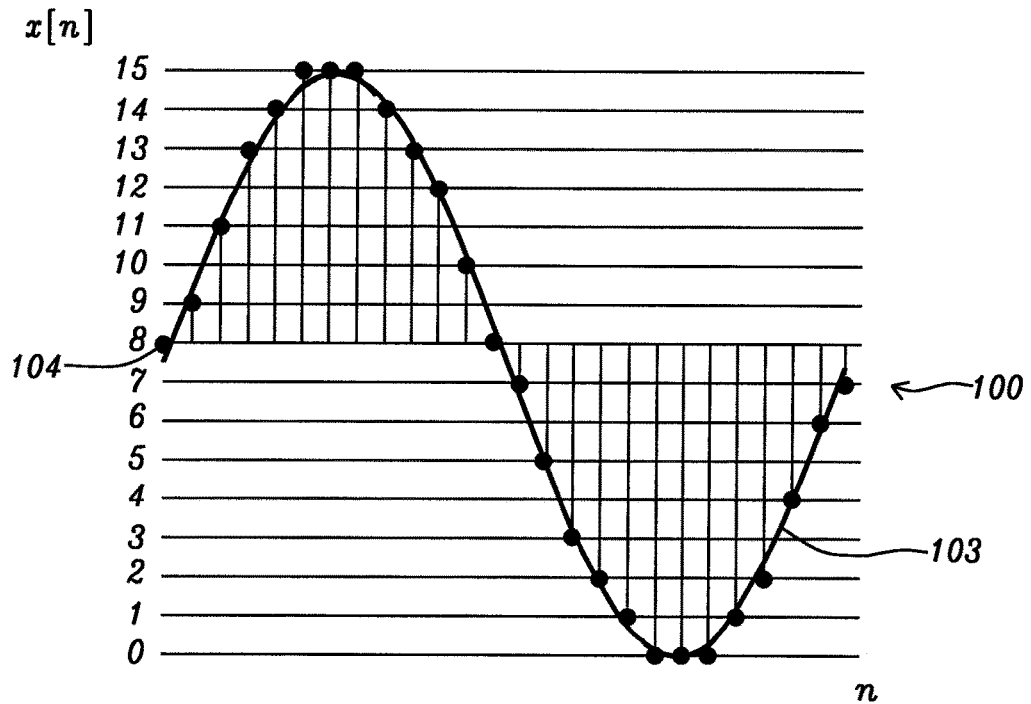
FIG. 1A is a graph of a pulse-code modulated (PCM) signal and FIG. 1B is a graph of a pulse-density modulated (PDM) signal.
Figure 2:
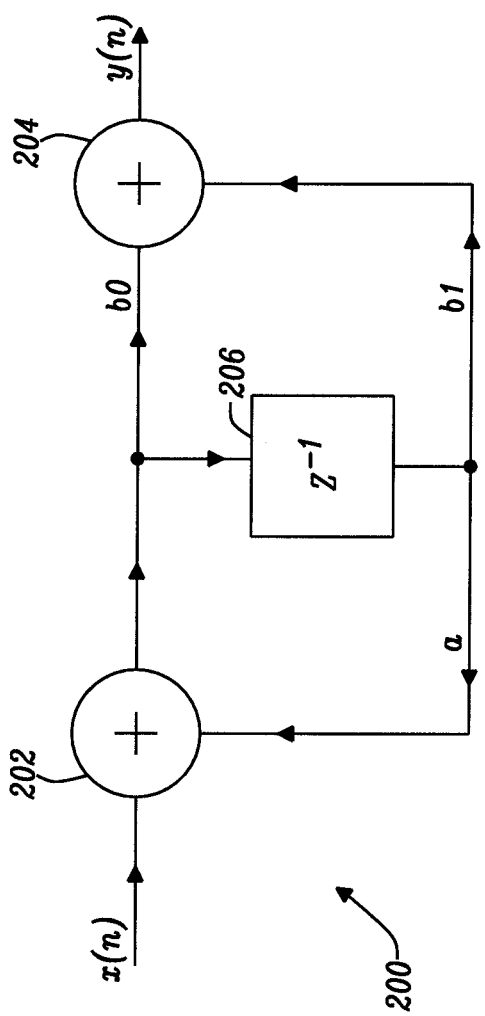
FIG. 2 is a schematic of a digital filter that is known in the prior art.

FIG. 2 is a schematic of a digital filter 200, and in particular a high pass filter, that is known in the prior art (Alan V. Oppenheim, Ronald W. Schafer; Discrete-Time Signal Processing, Third Edition; Pearson 2010). The digital filter 200 comprises adders 202, 204, and a delay circuit 206. Coefficients a, b0 and b1 are shown. The digital filter 200 receives an input signal x(n) and outputs the signal y(n). The digital filter 200 is an example of a filter that is unsuitable for filtering a PDM signal without first converting the PDM signal to a PCM signal.

The digital filter 200 is unsuitable for filtering PDM signals because for highly oversampled systems the coefficients will need to be very precise, which requires a very large word size. Furthermore, if the digital filter 200 comprises a quantizer positioned after the adder 202, quantization provided by the quantizer can lead to a bias which can result in artefacts like limit cycles.

Figure 3A:
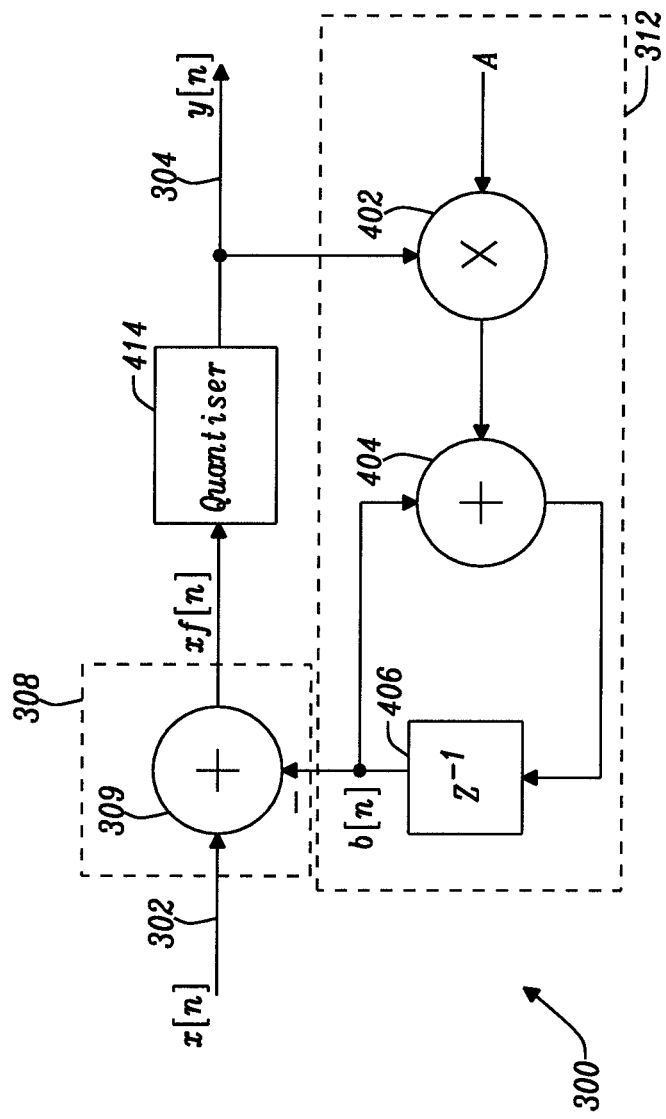
FIG. 3A is a schematic of a digital filter in accordance with a first embodiment of the present disclosure and FIG. 3B is a schematic of a digital filter in accordance with a second embodiment of the present disclosure.

FIG. 3A is a schematic of a digital filter 300 in accordance with a first embodiment of the present disclosure. The digital filter 300 comprises a filter circuit 308 that is configured to receive an input signal 302. The input signal 302 comprises input values at successive time steps and may be a PCM signal or a PDM signal as described previously.

The input values include a first input value at a first time step and a second input value at a second time step. The input signal may be represented by x[n], where x[n] is the input value at the time step n. "n" is a discrete time value as described previously. The first input value at the first time step may be represented by x[1] and the second input value at the second time step may be represented by x[2]. n is an integer in the present description such that we may refer to an nth time value or an nth input value, such that when n=1 there is provided the first time value and the first input value x[1] and when n=2, there is provided the second time value and the second input value x[2].

The filter circuit 308 is configured to provide a filtered input signal comprising filtered values at successive time steps. The filtered values include a first filtered value at the first time step and a second filtered value at a second time step. The first filtered value is provided by applying a first filter variable to the first input value x[1] and the second filtered value is provided by applying a second filter variable to the second input value x[2]. The filtered input signal may be represented by xf[n], where xf[n] is the filtered input value at the time step n. The first filtered input value at the first time step may be represented by xf[1] and the second filtered input value at the second time step may be represented by xf[2].

The first filter variable and the second filter variable may be estimates of the one or more frequency components to be attenuated in the input signal 302.

The digital filter 300 further comprises a quantiser 414 that is configured to provide an output signal 304 comprising output values at successive time steps. The output values include a first output value at the first time step and a second output value at the second time step. The output signal 304 is provided by quantising the filtered input signal xf[n]. The output signal 304 may be represented by y[n], where y[n] is the output value at the time step n. The first output value at the first time step may be represented by y[1] and the second output value at the second time step may be represented by y[2].

The first filter variable and the second filter variable are representative of one or more frequency components to be attenuated in the input signal 302. The first filter variable may be represented by b[1] and the second filter variable may be represented by b[2].

The output signal 304 may be equal to the filtered input signal xf[n]. For example, the first filtered value xf[1] may be equal to the first output value y[1] and the second filtered value xf[2] may be equal to the second output value y[2]. This may be generalised such that xf[n] is equal to y[n]. In further embodiments, the filtered input signal xf[n] may undergo further processing, resulting in the output signal 304 and the filtered input signal xf[n] being unequal.

In the embodiments described herein the input signal 302 may comprise two or more levels of quantisation and/or the output signal 304 may be comprise two or more levels of quantisation. The output signal 304 may have a different number of quantisation levels than the input signal 302. A signal having two levels of quantisation is a PDM signal.

The filter circuit 308 may comprise a summing circuit 309 that is configured to receive the input signal 302 and the first filter variable b[1] and to provide the first filtered value xf[1] by subtracting the first filter variable b[1] from the first input value x[1]. Therefore the first filtered value xf[1] may be given the following equation:

$$xf[1]=x[1]-b[1] \quad (1)$$

Additionally, the summing circuit 309 is configured to receive the second filter variable b[2] and to provide the second filtered value xf[2] by subtracting the second filter variable b[2] from the second input value x[2]. Therefore the second filtered value xf[2] may be given by the following equation:

$$xf[2]=x[2]-b[2] \quad (2)$$

The present description relates to the "first" and "second" values for the signals as previously described, however the terms "first" and "second" are not intended to be limiting but merely to aid in the clarity of the explanation. Therefore, it will be appreciated that equations (1) and (2) may be generalised as follows:

$$xf[n]=x[n]-b[n] \quad (3)$$

where xf[n] is the n-th filtered input value, x[n] is the n-th input value and b[n] is the n-th filter variable.

Furthermore the "first" time step may be when n=0, or any other integer in accordance with the understanding of the skilled person. Additionally, the "second" time step may not immediately succeed the "first" time step, in accordance with the understanding of the skilled person.

The digital filter 300 comprises a filter variable circuit 312 comprising a multiplication circuit 402 configured to detect the output signal 304 and to multiply the first output value y[1] by a gain factor A to provide a multiplied first output value Ay[1]. The filter variable circuit 312 further comprises a summing circuit 404 configured to receive the multiplied first output value Ay[1] and to add the multiplied first output value Ay[1] to the first filter variable b [1].

The filter variable circuit 312 further comprises a delay circuit 406 configured to receive the sum of the multiplied first output value Ay[1] and the first filter variable b[1]. The delay circuit 406 then provided the second filter variable b[2] for the next time step (n=2) to the first filter circuit 308. The second filter variable b[2] is equal to the sum of the multiplied first output value Ay[1] and the first filter variable b [1]. This relation can be represented by the following equation:

$$b[2]=Ay[1]+b[1] \quad (4)$$

It is possible to repeatedly update the filter variable b[n] for each successive time step. Therefore equation (4) may be generalised as follows:

$$b[n+1]=Ay[n]+b[n] \quad (5)$$

where b[n+1] is the (n+1)th filter variable, Ay[n] is the nth multiplied output value and b[n] is the nth filter variable.

In summary, the filter variable circuit 312 is configured to detect the output signal 304 and provide the second filter variable b[2] using the first output value y[1] as shown in equation (4). It will be appreciated that this relation may be generalised such that the filter variable circuit 312 may be configured to detect the output signal 304 and provide the (n+1)th filter variable b[n+1] using the n-th output value y[n] as shown in equation (5).

In operation, the digital filter 300 filters the input signal 302 by attenuating or blocking one or more frequency components in the generation of the filtered input signal xf[n]. This filtered input signal xf[n] is then quantised by the quantiser 414 and the output signal 304 is fed back into the filter variable circuit 312 to update the filter variable b[n] that is used to attenuate the one or more frequency components from the input signal 302.

The process is repeated, with the filter variable (b[n]) being updated for each time step (n), using the output value (y[n−1]) for the previous time step.

In the embodiments described herein, the digital filter 300 may be configured as a high pass filter such that the frequency components to be attenuated in the input signal 302 are low frequency components. Alternatively, the digital filter 300 may be configured as a low pass filter such that the frequency components to be attenuated in the input signal 302 are high frequency components. Alternatively, the digital filter 300 may be configured as a band reject filter such that the frequency components to be attenuated in the input signal 302 are over a finite frequency band. Alternatively, the digital filter 300 may be configured as a band pass filter such that the frequency components to be attenuated in the input signal 302 are high and low frequency components either side of a frequency band to be passed.

The filter variables b[n] (for example the first filter variable b[1]) may be an estimate of the one or more frequency components to be attenuated in the input signal 302. The filter variable b[n] may be referred to as a state variable or a coefficient.

Figure 3B:
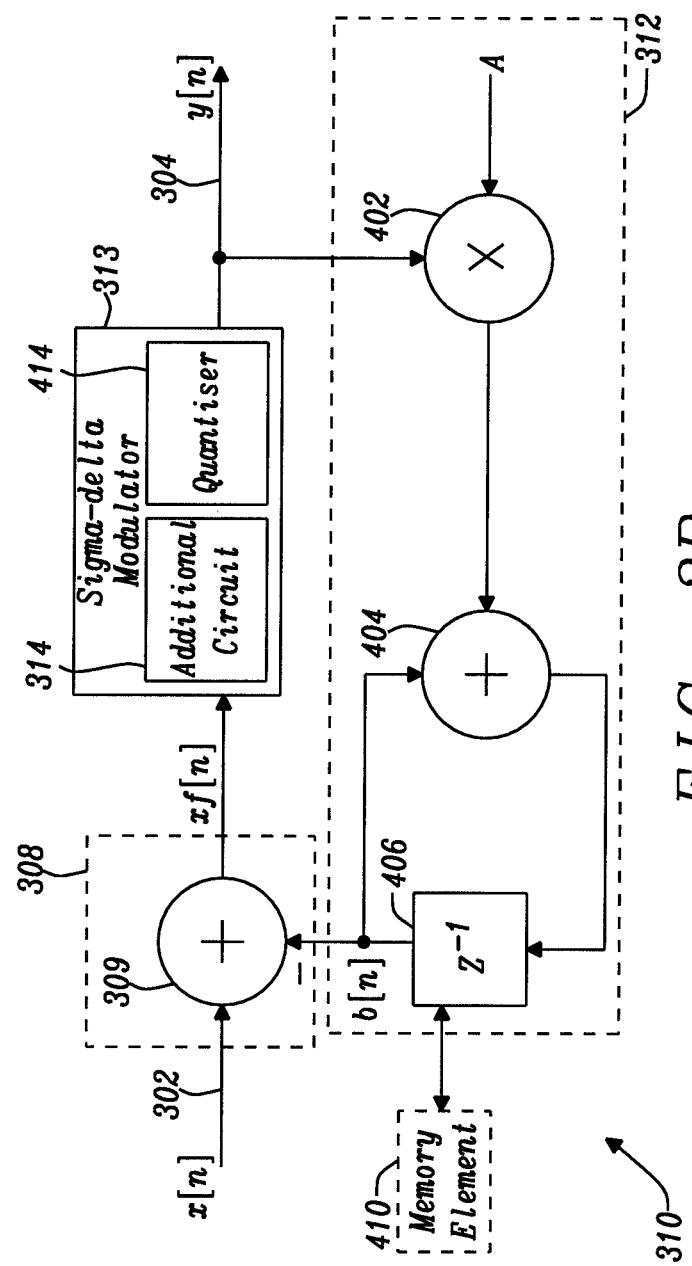

FIG. 3B is a schematic of a digital filter 310 in accordance with a second embodiment of the present disclosure. The digital filter 310 corresponds to the digital filter 300 with the addition of a sigma-delta modulator 313. Therefore common features between figures share common reference numerals and variables.

The digital filter 310 comprises the sigma-delta modulator 313 which comprises the quantiser 414. The sigma-delta modulator 313 is configured to receive and process the filtered input signal xf[n]. Processing of the filtered input signal xf[n] may be carried out prior to, and/or after quantisation and generation of the output signal y[n]. This processing may be performed by additional circuitry 314, as shown in FIG. 3B, that is positioned in the signal path before the quantiser 414 as shown in FIG. 3B or alternatively, after the quantiser 414 or in parallel with the quantiser 414 in accordance with the understanding of the skilled person.

The digital filter 310 may comprise a memory element 410 for storing the filter variable b[n], for example the first filter variable b[1] and/or the second filter variable b[2]. The first filter variable b[1] may be a user defined value and may, for example, be equal to zero. The memory element 410 may provide the first filter variable b[1] to the delay circuit 406 for use at the first time step (n=1).

The memory element 410 may be configured to store the filter variable b[n] at any time step n in the cycle. A reset operation, where the process is restarted and n is reset to 1 may comprise setting the first filter variable b[1] to the last filter variable b[n] value generated by the filter variable circuit 312 or the last filter variable b[n] value that was stored in the memory element 410. This may be used to reduce the settling time of the digital filter 310 in the case of a system where the frequency component to be attenuated is known to be consistent over time.

The sigma-delta modulator 310 is configured to receive the filtered input signal xf[n] and to generate the output signal y[n]. For the first time step (n=1) this functionality may be represented by the following equation:

$$y[1]=\text{SDM}(xf(1))=\text{SDM}(x[1]-b[1]) \quad (6)$$

Equation (6) may be generalised as follows:

$$y[n]=\text{SDM}(xf(n))=\text{SDM}(x[n]-b[n]) \quad (7)$$

"SDM" is representative of the sigma-delta modulation process applied to generate the output signal y[n] as will be clear to the skilled person. The sigma-delta modulator 313 may generate the output signal y[n] having two or more levels of quantisation. The output signal y[n] having two levels of quantisation is a PDM signal.

The following description will relate to the digital filter 310 configured as a high pass filter and therefore the frequency components to be attenuated in the input signal 302 are low frequency components. It will be clear the skilled person how the digital filter may be configured to function as a low pass filter, a band pass filter or a band reject filter, as previously discussed.

For example, in a further embodiment where the digital filter 310 is configured to function as a low pass filter, an additional component may be inserted between the delay circuit 406 and the filtering circuit 308 that multiplies the filter factor b [n] by an alternating sequence of +1 and −1 for each time step.

When the digital filter 310 is configured to function as a high pass filter, the filter variable circuit 312 may be referred to as a DC estimator.

The recurrence relations for the digital filter 310 are provided by equations (5) and (7), which differ from the recurrence relations of a prior art first order high pass filter, such as the digital filter 200. A recurrence relation for the high pass filter 200 is as follows:

$$y[n]=A(y[n-1]+x[i]-x[i-1]) \quad (8)$$

where the variables have their meanings as previously described, and i is a discrete time step.

The recurrence relations may alternatively be referred to as difference relations.

In summary, the digital filter 310 uses a single coefficient (the filter variable b[n]) to continually estimate the level of the low frequency component of the input signal 302. The output signal 304 is calculated by subtracting the updated estimate of the filter variable b[n] from the input signal 302 on the subsequent sample.

The digital filter 310 can provide a high pass filter that operates directly on a PDM signal. The output signal 304 of the filter may also be a PDM signal, as the digital filter 310 comprises the sigma-delta modulator 313 on the output.

In practice, it is beneficial to implement the gain factor A as a power of 2, so that the multiplication circuit 402 reduces the multiplied output signal Ay[n] to a fixed binary shift down of the output signal 304. This also allows the multiplication to be performed with no rounding error. Additionally, this also allows the output of the multiplication to be encoded by the same number of bits as the input, without introducing a rounding error.

Digital filters for DC removal are presented in: Richard G. Lyons; Understanding Digital Processing, Second Edition; Pages 83-87; Prentice Hall PTR; 15 Mar. 2004, however none of the digital filters presented have both the quantizer 414 in the signal path for generating the output signal 304 and the filter variable circuit 312 comprising the multiplication circuit 402, the summing circuit 404 and the delay circuit 406.

In the present disclosure, the quantizer 414 is included in the signal path which simplifies the process of multiplication and addition of the output signal 304 using multiplication circuits and addition circuits, respectively. Quantising the output signal 304 before it is multiplied by the gain factor A means that the output signal 304 has a smaller number of bits than would be the case without the inclusion of the quantizer 414 at this point. This enables the multiplication circuit 402 to be implemented using less hardware than would be required if the output signal 304 was not quantised. The filter variable circuit 312 described herein provides a multiplication that enables a more efficient translation into a shift. Additionally, the filter variable circuit 312 described herein may provide an efficient multiplication method when using a gain factor A that is a power of two. When the gain factor A is a power of two, the multiplication is simply a shift operation. Therefore, the combination of these features provides simpler and more efficient multiplication and addition operations when compared with the prior art. This enables the associated multiplication circuits and addition circuit to have simpler implementations that occupy less hardware area than the complex implementations of the prior art.

Figure 4A:
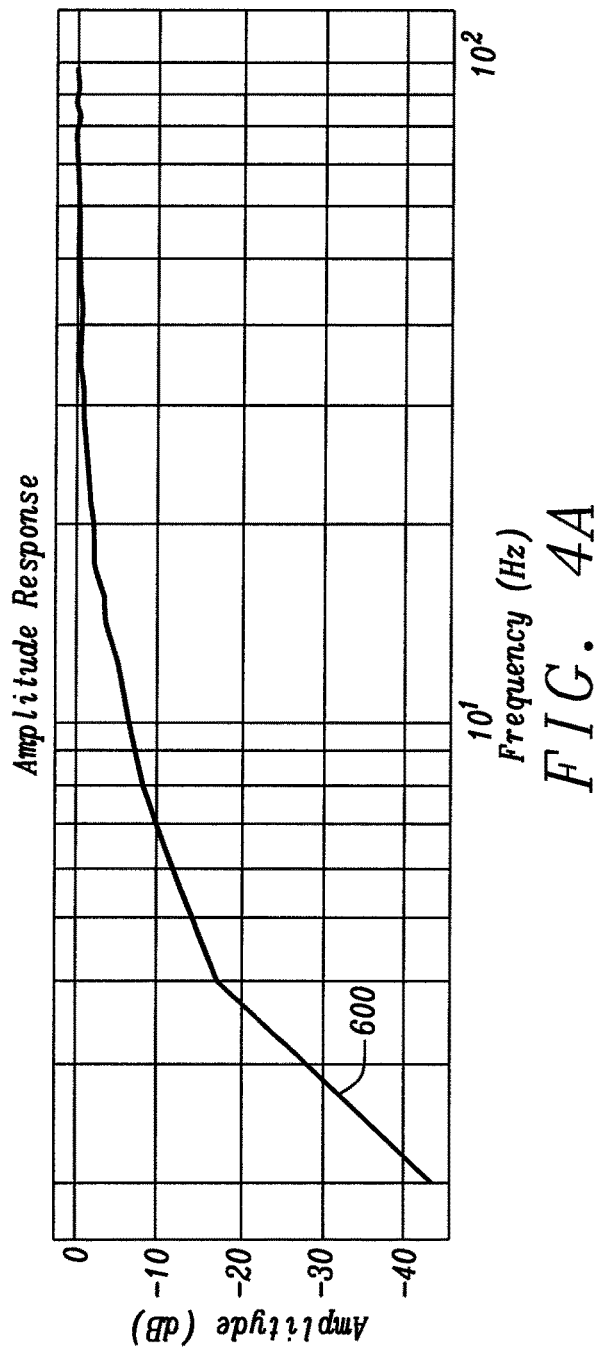
FIG. 4A is a graph of amplitude versus frequency of a practical implementation of the digital filter of FIG. 3B.
Figure 4B:
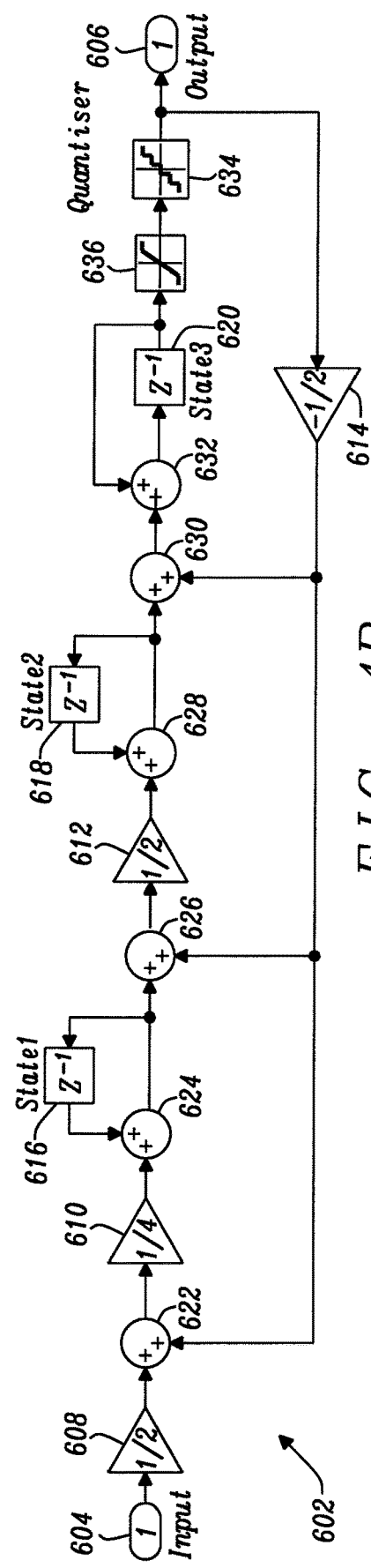
FIG. 4B is a schematic of a $3^{rd}$ order sigma-delta modulator suitable for use in the digital filter of FIG. 3B.

FIG. 4A is a graph of the amplitude versus frequency response 600 of a practical implementation of the digital filter 310. The implementation of the digital filter 310 simulated for FIG. 4A comprises a $3^{rd}$ order sigma-delta modulator with five quantisation levels, giving a cut-off frequency of around 10 Hz, and the multiplication circuit 402 uses a gain factor A that is equal to $2^{-16}$. FIG. 4B is a schematic of a $3^{rd}$ order sigma-delta modulator 602 used to implement the sigma-delta modulator 313 of the digital filter 310, for the simulation results shown in FIG. 4A. The use of a sigma-delta modulator entails a choice about the order of sigma-delta modulator used and the number of quantisation levels used to represent the output signal 304.

The sigma-delta modulator 602 comprises an input 604, an output 606, amplifiers 608, 610, 612, 614, delay circuits 616, 618, 620, adders 622, 624, 626, 628, 630, 632, a quantiser 634 and an integrator 636. The sigma-delta modulator 602 will have stability problems for data above −12 dBFS. The quantiser 624 may correspond to the quantiser 414 as previously described.

Depending on the signal to noise ratio (SNR) requirements of signal processing elements using the output signal 304 of the digital filter 310, it may be desirable to use a sigma-delta modulator of order greater than two. However, this can lead to instability of the sigma-delta modulator output when the in-band signal represented by the PDM input signal 302 has a large magnitude.

Figure 5:
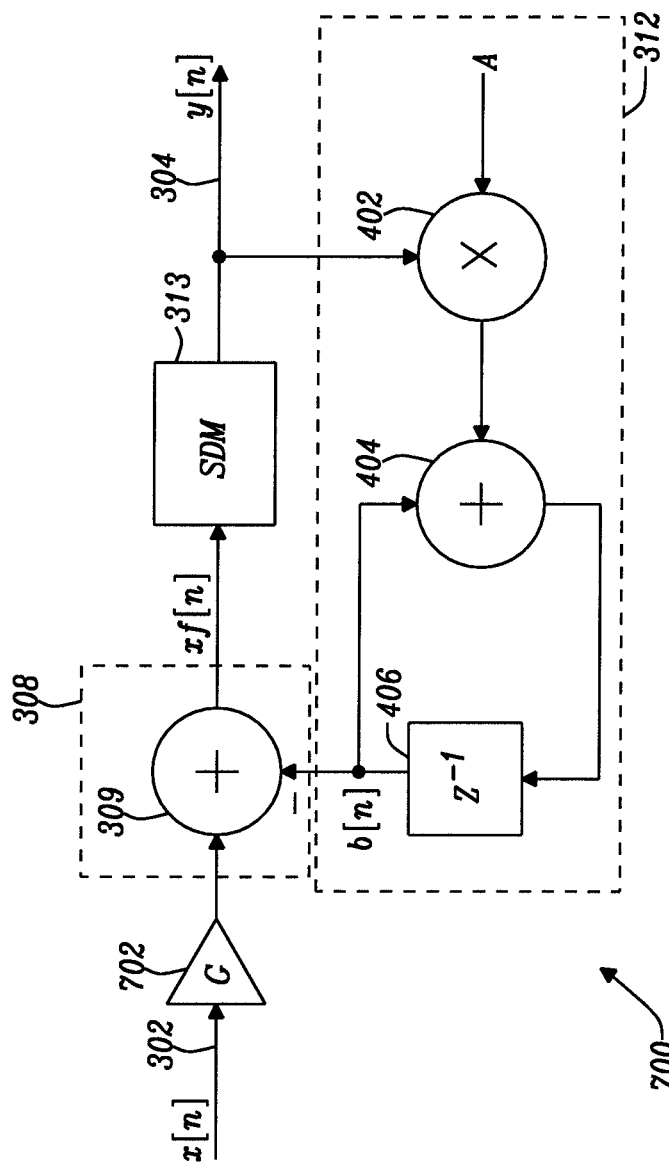
FIG. 5 is a schematic of a digital filter in accordance with a third embodiment of the present disclosure.

FIG. 5 is schematic of a digital filter 700 in accordance with a third embodiment of the present disclosure. The digital filter 700 corresponds to the digital filter 310 with the addition of an attenuation circuit 702 and therefore common features between figures share common reference numerals and variables.

The digital filter 700 comprises the attenuation circuit 702 that is configured to attenuate the input signal 302 prior to the filtered input signal xf[n] being provided.

The attenuation circuit 702 acts to decrease the magnitude of the input signal 302, thereby mitigating or preventing instability of the sigma-delta modulator 313 output which can occur if the magnitude of the input signal 302 is too high. In the present embodiment, a fixed attenuation G is applied to the input signal 302. The attenuation can be chosen to ensure the magnitude of the input signal 302 is never high enough to affect the stability of the sigma-delta modulator 313. It may be necessary to compensate for the attenuation G at a later stage of the signal chain. It will be appreciated that "the signal chain" is in reference to the path of the input signal 302 as it is converted to the output signal 304.

The inclusion of the attenuation circuit 702 provides a pre-gain stage that can improve the stability of the sigma-delta modulator 313 for high input signal levels if the sigma-delta modulator 313 has an order greater than two.

As an alternative to applying a pre-gain stage to the input signal 302 to achieve stability with high amplitude input signals, an alternative method using a forward estimation adaptive sigma-delta modulator may be applied. These sigma-delta modulator designs allow an estimate of the magnitude of the input signal 302 to be used to vary the behaviour of the sigma-delta modulator to ensure stability, however prior art methods are impractical within the context of the present disclosure. Alternatively, a backward estimation adaptive sigma-delta modulator may be used. In this case the output signal 304 of the sigma-delta modulator is used to guide the adaptive part of the sigma-delta modulator in use.

In both feedforward (forward estimation) and feedback (backward estimation) cases, a dynamically determined sigma-delta modulator gain based on the estimation of the strength of the input signal 302 would be appropriate, as detailed in: M. A. Aldajani and A. H. Sayed, "Stability analysis of an adaptive structure for sigma delta modulation," ICECS 2000. 7th IEEE International Conference on Electronics, Circuits and Systems (Cat. No.00EX445), Jounieh, Lebanon, 2000, pp. 129-132 vol.1; and M. A. Aldajani and A. H. Sayed, "Stability and performance analysis of an adaptive sigma-delta modulator," in IEEE Transactions on Circuits and Systems II: Analog and Digital Signal Processing, vol. 48, no. 3, pp. 233-244, Mar. 2001. The sigma-delta modulator gain may have to be compensated for at a later stage if required.

The prior art approach is unsuitable for an input signal that is a PDM signal. For a PDM signal, the input signal 302 is quantised to a very low number of bits, typically one bit representing two values (+1 and −1). As such, there is no direct measure of the signal amplitude and therefore signal magnitude in the frequency band of interest.

Figure 6:
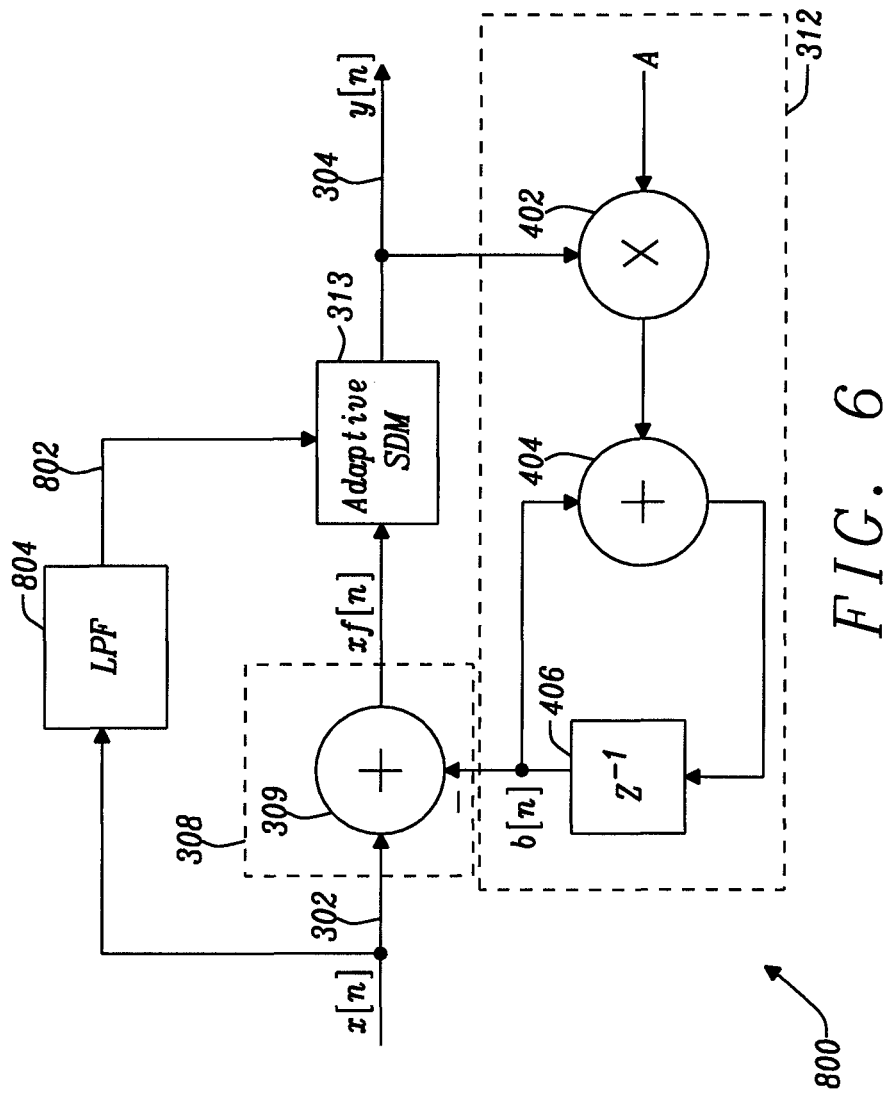
FIG. 6 is a schematic of a digital filter in accordance with a fourth embodiment of the present disclosure.

FIG. 6 is schematic of a digital filter 800 in accordance with a fourth embodiment of the present disclosure. The digital filter 800 shares features with digital filter 310 and therefore common features between figures share common reference numerals and variables.

The sigma-delta modulator 313 is configured to apply a sigma-delta modulator gain to the filtered input signal xf[n] in the generation of the output signal 304. In the present embodiment, the sigma-delta modulator 313 is an adaptive sigma-delta modulator and therefore the sigma-delta modulator gain may be adjusted.

In the present embodiment the sigma-delta modulator 313 is configured to receive an indicator signal 802 that is representative of a magnitude of the input signal 302. In particular, the indicator signal 802 may be representative of the magnitude of the input signal 302 at a frequency band of interest which may be the audio band (less than 24 kHz). The sigma-delta modulator gain is adjusted based on the indicator signal 802.

A sampled signal can represent frequencies up to half of the sampling frequency. Sigma-delta modulated signals, as output by a sigma delta modulator (such as the output signal 304 provided by the sigma-delta modulator 313) in audio applications may be sampled at several megahertz. Therefore, the output signal 304 may contain a lot of content above the highest frequency of human hearing, which in audio applications may be considered "out-of-band".

In the present embodiment, the indicator signal 802 is provided by a filter circuit 804 configured to detect the input signal 302 and provide the indicator signal 802 to the sigma-delta modulator 313. The indicator signal 802 is dependent on the input signal 302.

In the present embodiment, the digital filter 800 is configured as a high pass filter such that the frequency components to be attenuated in the input signal 302 are low frequency components and the filter circuit 804 is a low pass filter. Therefore the indicator signal 802 is a low passed input signal 302.

It will be appreciated that in further embodiments, the digital filter 800 may be configured to function as a different type of filter, such as a band pass filter, a band reject filter and a low pass filter, as discussed previously. In such embodiments, the filter circuit 804 may be a low pass filter.

In the present embodiment the digital filter 800 comprises the filter circuit 804.

The input signal 302 is low pass filtered in parallel with the high-pass filter operation of the digital filter 800. This converts the input signal 302 from PDM data into PCM data that represents the input signal 302 in the frequency band of interest at a high sampling rate. It is possible to estimate the magnitude of the input signal 302 after the input signal 302 has been converted into PCM data. Whilst this approach has the disadvantage of requiring a large area for a hardware filter for implementation of the filter circuit 804 to perform the low-pass filtering, that low-pass filter is not directly in the signal path and so the associated filtering delay does not affect the desired high-pass filtering operation.

The indicator signal 802 may correspond to the low pass filtered input signal 302, with the sigma-delta modulator 313 itself determining a suitable sigma-delta modulator gain based on an estimation of the magnitude of the input signal 302 based on the indicator signal 802. The sigma-delta modulator 313 can then function as a forward estimation adaptive sigma-delta modulator, with the low-passed input signal 302 used as an input to the sigma-delta modulator 313 from which the sigma-delta modulator 313 can adjust its gain to maintain stability at higher input levels where the input signal 302 has an otherwise unsuitably high magnitude.

The present embodiment provides an adaptive sigma-delta modulator to achieve an improvement in SNR compared with a non-adaptive sigma-delta modulator, whilst remaining stable at higher input levels when a sigma-delta modulator of order of greater than two is used.

Figure 7:
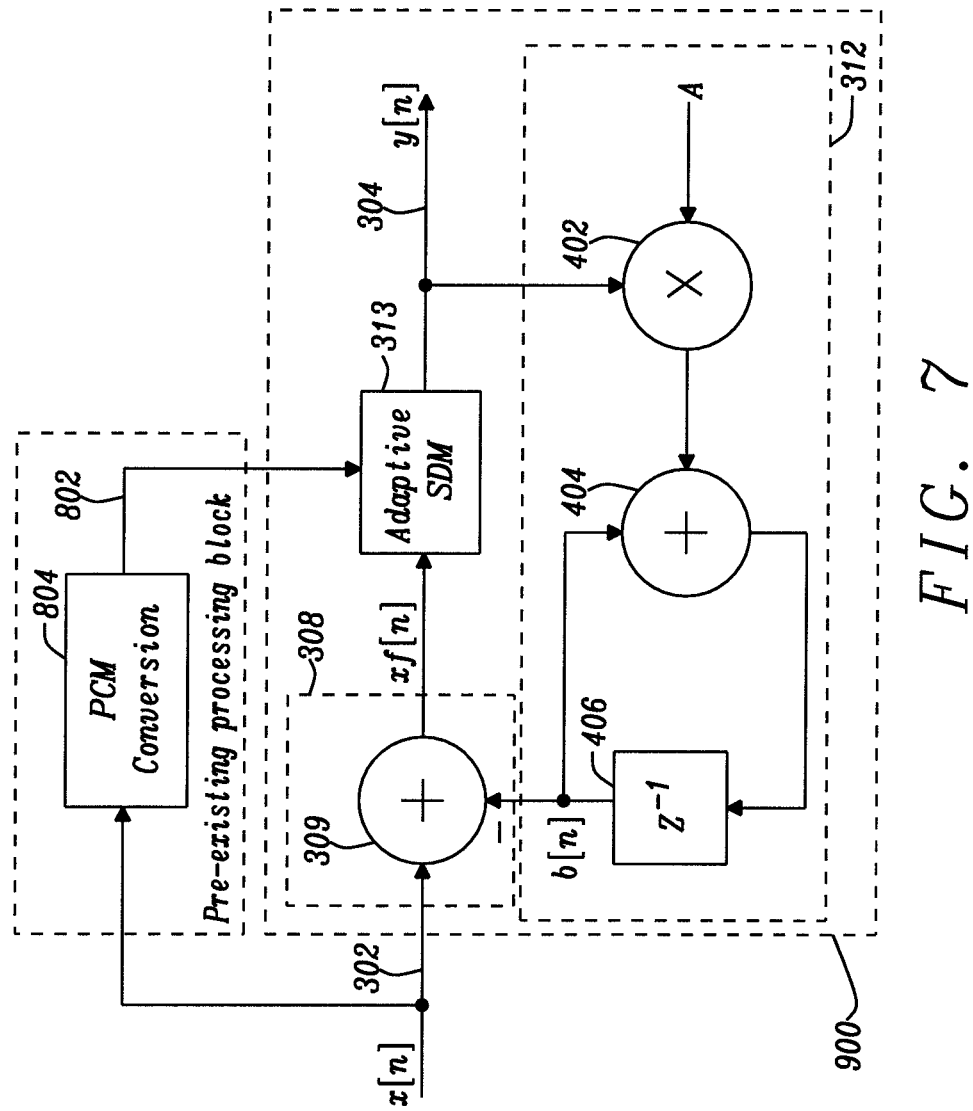
FIG. 7 is a schematic of a digital filter in accordance with a fifth embodiment of the present disclosure.

FIG. 7 is schematic of a digital filter 900 in accordance with a fifth embodiment of the present disclosure. The digital filter 900 shares features with digital filter 800 and therefore common features between figures share common reference numerals and variables.

In the present embodiment, the filter circuit 804 is an external component to the digital filter 900. This may save hardware area when there is already parallel processing of the input signal 302 that produces a low pass version of the input signal 302 resulting in its conversion from PDM to PCM. In the case where another component of the overall system design already produces a low-pass filtered version of the input signal 302, that low-pass filtered signal may be provided directly to the sigma-delta modulator 313 in the digital filter 900. Thus, to implement standard forward estimation adaptive sigma-delta modulator in this case, the digital filter 900 can receive the indicator signal 802 from an external component, rather than having an estimation of the magnitude of the input signal 302 being made within the digital filter 900, as is the case in the digital filter 800 of FIG. 6.

In the present embodiment, the digital filter 900 uses an output of a filter circuit 804 working in parallel to the digital filter 900, which makes use of the same inputs to estimate the magnitude of the input signal 302 in the frequency band of interest. The sigma-delta modulator 313 can then be a forward estimation adaptive sigma-delta modulator, with the low pass filtered input signal 302 functioning as the indicator signal 802 and used as an input to the sigma-delta modulator 313 from which the sigma-delta modulator 313 can adjust its gain to maintain stability at input signal levels that would otherwise cause instability.

In the present embodiment, use of pre-existing filtering chain (the filter circuit 804) to provide input level estimation for an adaptive sigma-delta modulator, can save area compared to the embodiment presented in FIG. 6.

Figure 8:
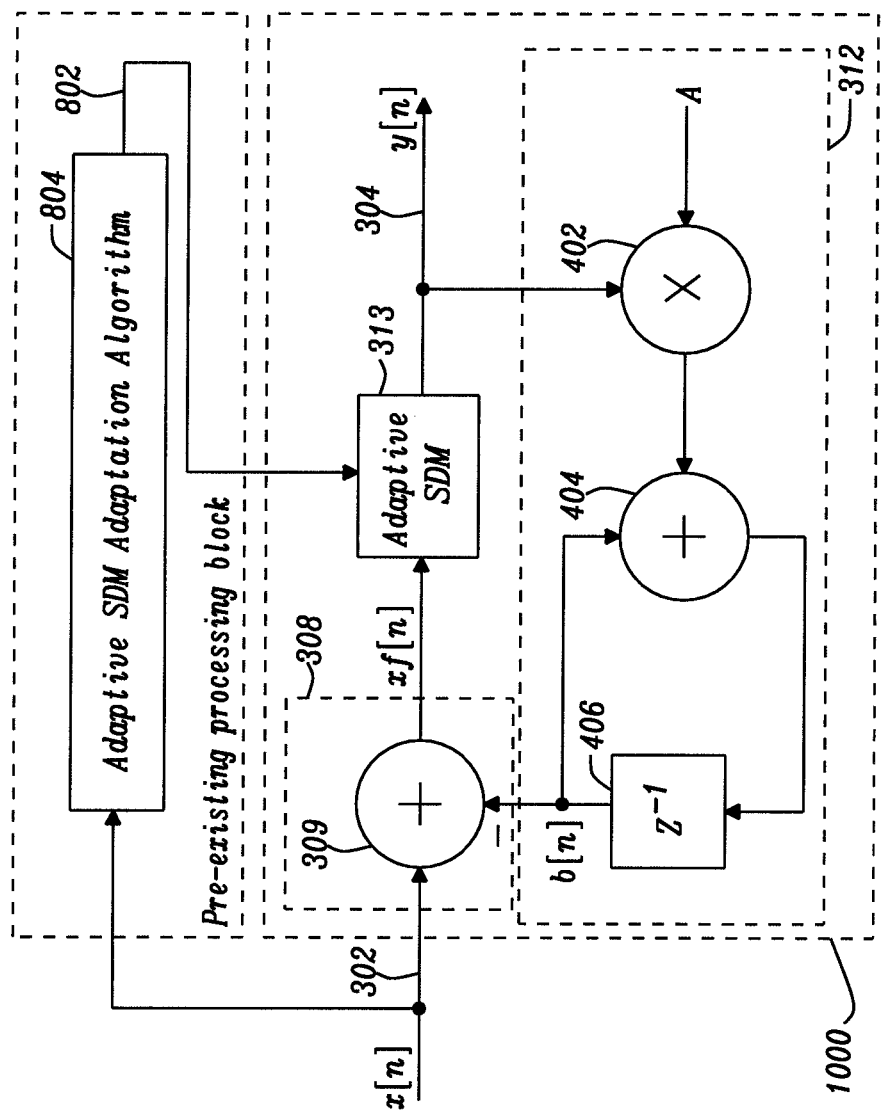
FIG. 8 is a schematic of a digital filter in accordance with a sixth embodiment of the present disclosure.

FIG. 8 is schematic of a digital filter 1000 in accordance with a sixth embodiment of the present disclosure. The digital filter 1000 shares features with digital filter 900 and therefore common features between figures share common reference numerals and variables.

In the present embodiment, the filter circuit 804 is configured to run an algorithm to determine a suitable sigma-delta modulator gain based on the magnitude of the input signal 302 at the one or more frequency components to be attenuated as estimated using the input signal 302. The indicator signal 802 is based on the sigma-delta modulator gain determined by the algorithm.

If the filter circuit 804 in the parallel processing chain comprises a configurable block such as a generic Digital Signal Processor (DSP), then the digital filter 1000 could be modified to have inputs representing an adapted state for the adaptive sigma-delta modulator 313. The advantage of using this scheme is that a DSP might be able to make the decision to determine a suitable sigma-delta modulator gain based on a more complex algorithm than might have been implemented in hardware within the sigma-delta modulator 313.

The further advantage is that no decision-making hardware is required within the sigma-delta modulator 313. Therefore, the algorithm itself may be updated using software and without changing the sigma-delta modulator 313 hardware.

Figure 9:
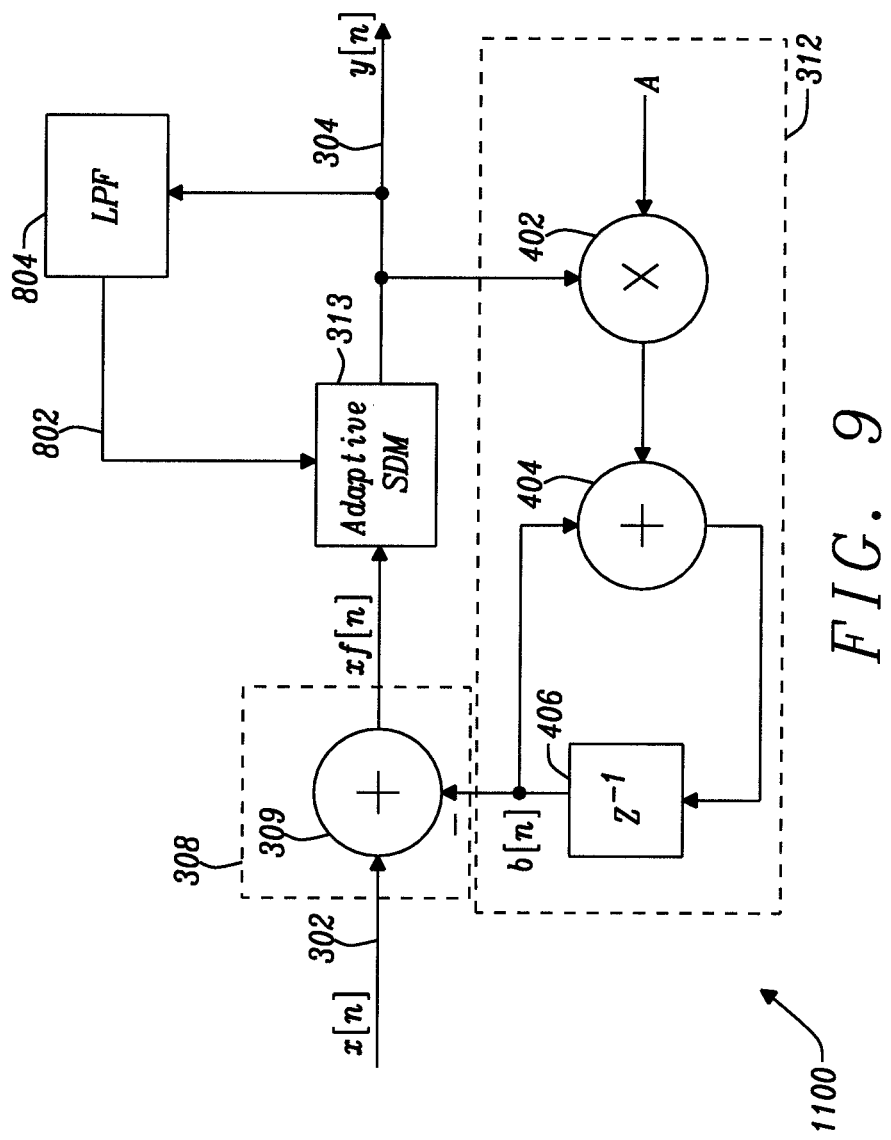
FIG. 9 is a schematic of a digital filter in accordance with a seventh embodiment of the present disclosure.

FIG. 9 is schematic of a digital filter 1100 in accordance with a seventh embodiment of the present disclosure. The digital filter 1100 shares features with digital filter 800 and therefore common features between figures share common reference numerals and variables. The digital filter 1100 is a backward estimation scheme as the second filter circuit is configured to detect the output signal 304 instead of the input signal 302. The indicator signal 802 in this case is dependent on the output signal 304. It will be clear to the skilled person how the embodiments presented in FIGS. 7 and 8 can be adapted to use a backward estimation scheme.

Figure 10:
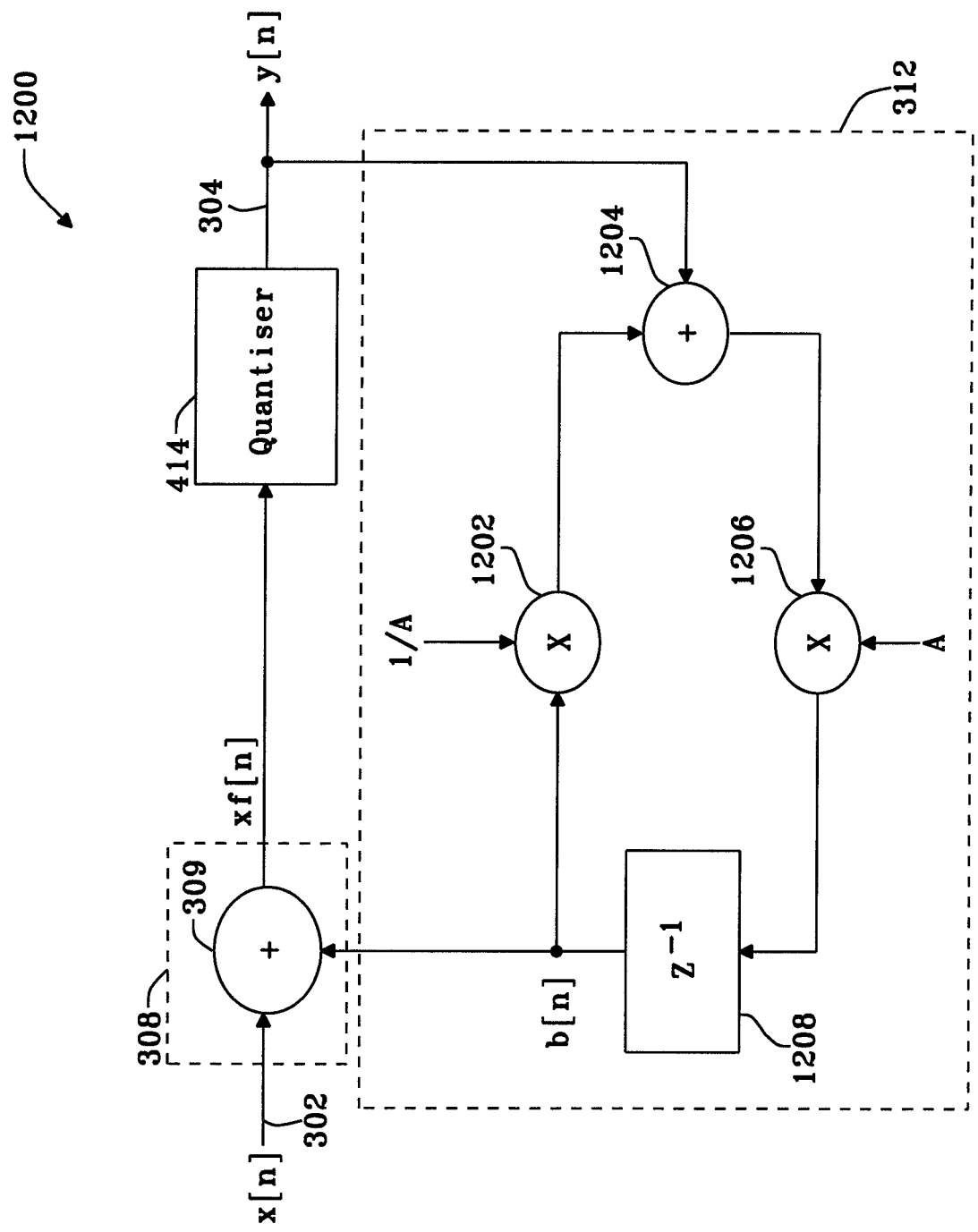
FIG. 10 is a schematic of a digital filter in accordance with an eighth embodiment of the present disclosure.

FIG. 10 is a schematic of a digital filter 1200 in accordance with an eighth embodiment of the present disclosure. The digital filter 1200 shares features with the digital filter 300 and therefore common features between figures share common reference numerals and variables. The digital filter 1200 comprises an alternative implementation of the filter variable circuit 312 when compared with the digital filter 300. It will be appreciated that the alternative implementation of the filter variable circuit 312 of the digital filter 1200 may be implemented in any of the digital filters as described herein, and in accordance with the understanding of the skilled person.

The digital filter circuit 1200 comprises the filter circuit 308 that is configured to receive the input signal 302. The input signal 302 comprises input values at successive time steps and may be a PCM signal or a PDM signal as described previously.

The input values include a first input value at a first time step and a second input value at a second time step. The input signal may be represented by $x[n]$, where $x[n]$ is the input value at the time step n. "n" is a discrete time value as described previously. The first input value at the first time step may be represented by $x[1]$ and the second input value at the second time step may be represented by $x[2]$. n is an integer in the present description such that we may refer to an nth time value or an nth input value, such that when n=1 there is provided the first time value and the first input value $x[1]$ and when n=2, there is provided the second time value and the second input value $x[2]$.

The filter circuit 308 is configured to provide a filtered input signal comprising filtered values at successive time steps. The filtered values include a first filtered value at the first time step and a second filtered value at a second time step. The first filtered value is provided by applying a first filter variable to the first input value $x[1]$ and the second filtered value is provided by applying a second filter variable to the second input value $x[2]$. The filtered input signal may be represented by $xf[n]$, where $xf[n]$ is the filtered input value at the time step n. The first filtered input value at the first time step may be represented by $xf[1]$ and the second filtered input value at the second time step may be represented by $xf[2]$.

The first filter variable and the second filter variable may be estimates of the one or more frequency components to be attenuated in the input signal 302.

The digital filter 300 further comprises a quantizer 414 that is configured to provide an output signal 304 comprising output values at successive time steps. The output values include a first output value at the first time step and a second output value at the second time step. The output signal 304 is provided by quantising the filtered input signal $xf[n]$. The output signal 304 may be represented by $y[n]$, where $y[n]$ is the output value at the time step n. The first output value at the first time step may be represented by y[1] and the second output value at the second time step may be represented by y[2].

The first filter variable and the second filter variable are representative of one or more frequency components to be attenuated in the input signal 302. The first filter variable may be represented by b[1] and the second filter variable may be represented by b[2]. The first filter variable b[1] may be a user defined value. The first filter variable b[1] and the second filter variable b[2] may be estimates of the one or more frequency components to be attenuated in the input signal 302.

The output signal 304 may be equal to the filtered input signal xf[n]. For example, the first filtered value xf[1] may be equal to the first output value y[1] and the second filtered value xf[2] may be equal to the second output value y[2]. This may be generalised such that xf[n] is equal to y[n]. In further embodiments, the filtered input signal xf[n] may undergo further processing, resulting in the output signal 304 and the filtered input signal xf[n] being unequal.

In the embodiments described herein, the input signal 302 may comprise two or more levels of quantisation and/or the output signal may comprise two or more levels of quantisation. The output signal 304 may have a different number of quantisation levels than the input signal 302. A signal having two levels of quantisation is a PDM signal.

The filter circuit 308 may comprise the summing circuit 309 configured to receive the input signal 302, the first filter variable b[1] and the second filter variable b[2], to provide the first filtered value xf[1] by subtracting the first filter variable b[1] from the first input value x[1] (as represented by equation (1)), and to provide the second filtered value xf[2] by subtracting the second filter variable b[2] from the second input value x[2] (as represented by equation (2)). As described previously, equations (1) and (2) are described generally by equation (3).

The digital filter 1200 comprises the filter variable circuit 312. In the present embodiment the filter variable circuit 312 comprises a multiplication circuit 1202 configured to receive the first filter variable b[1] and to divide the first filter variable b[1] by the gain factor A. The gain factor A may be a power of two.

The filter variable circuit 312 further comprises a summing circuit 1204 configured to receive the divided first filter variable b[1]/A, to receive the output signal 304 and to add the divided first filter variable b[1]/A and the first output value y[1].

The filter variable circuit 312 further comprises a multiplication circuit 1206 configured to receive the sum of the divided first filter variable b[1]/A and the first output value y[1] and to multiply the sum of the divided first filter variable b[1]/A and the first output value y[1] by the first gain factor A.

The filter variable circuit 312 further comprises a delay circuit 1208 configured to receive the sum of the divided first filter variable b[1]/A and the first output value y[1] multiplied by the first gain factor A, and to provide the second filter variable b[2] to the first filter circuit 308. The second filter b[2] variable being equal to the sum of the divided first filter variable b[1]/A and the first output value y[1] multiplied by the first gain factor A. The first filter variable b[1] and the second filter variable b[2] are representative of one or more frequency components to be attenuated in the input signal 302.

The second filter variable b[2] in the present embodiment may be represented by the following equation:

$$b[2] = \frac{b[1]}{A} + Ay[1] \quad (9)$$

It is possible to repeatedly update the filter variable b[n] for each successive time step. Therefore equation (9) may be generalised as follows:

$$b[n+1] = \frac{b[n]}{A} + Ay[n] \quad (10)$$

where b[n+1] is the (n+1)th filter variable, Ay[n] is the nth multiplied output value and b[n] is the nth filter variable.

In operation, the digital filter 1200 filters the input signal 302 by attenuating or blocking one or more frequency components in the generation of the filtered input signal xf[n]. This filtered input signal xf[n] is then quantised by the quantiser 414 and the output signal 304 is fed back into the filter variable circuit 312 to update the filter variable b[n] that is used to attenuate the one or more frequency components from the input signal 302.

The process is repeated, with the filter variable (b[n]) being updated for each time step (n), using the output value (y[n−1]) for the previous time step.

In the embodiments described herein, the digital filter 1200 may be configured as a high pass filter such that the frequency components to be attenuated in the input signal 302 are low frequency components. Alternatively, the digital filter 1200 may be configured as a low pass filter such that the frequency components to be attenuated in the input signal 302 are high frequency components. Alternatively, the digital filter 1200 may be configured as a band reject filter such that the frequency components to be attenuated in the input signal 302 are over a finite frequency band. Alternatively, the digital filter 1200 may be configured as a band pass filter such that the frequency components to be attenuated in the input signal 302 are high and low frequency components either side of a frequency band to be passed.

The filter variables b[n] (for example, the first filter variable b[1]) may be an estimate of the one or more frequency components to be attenuated in the input signal 302. The filter variable b[n] may be referred to as a state variable or a coefficient.

Figure 11:
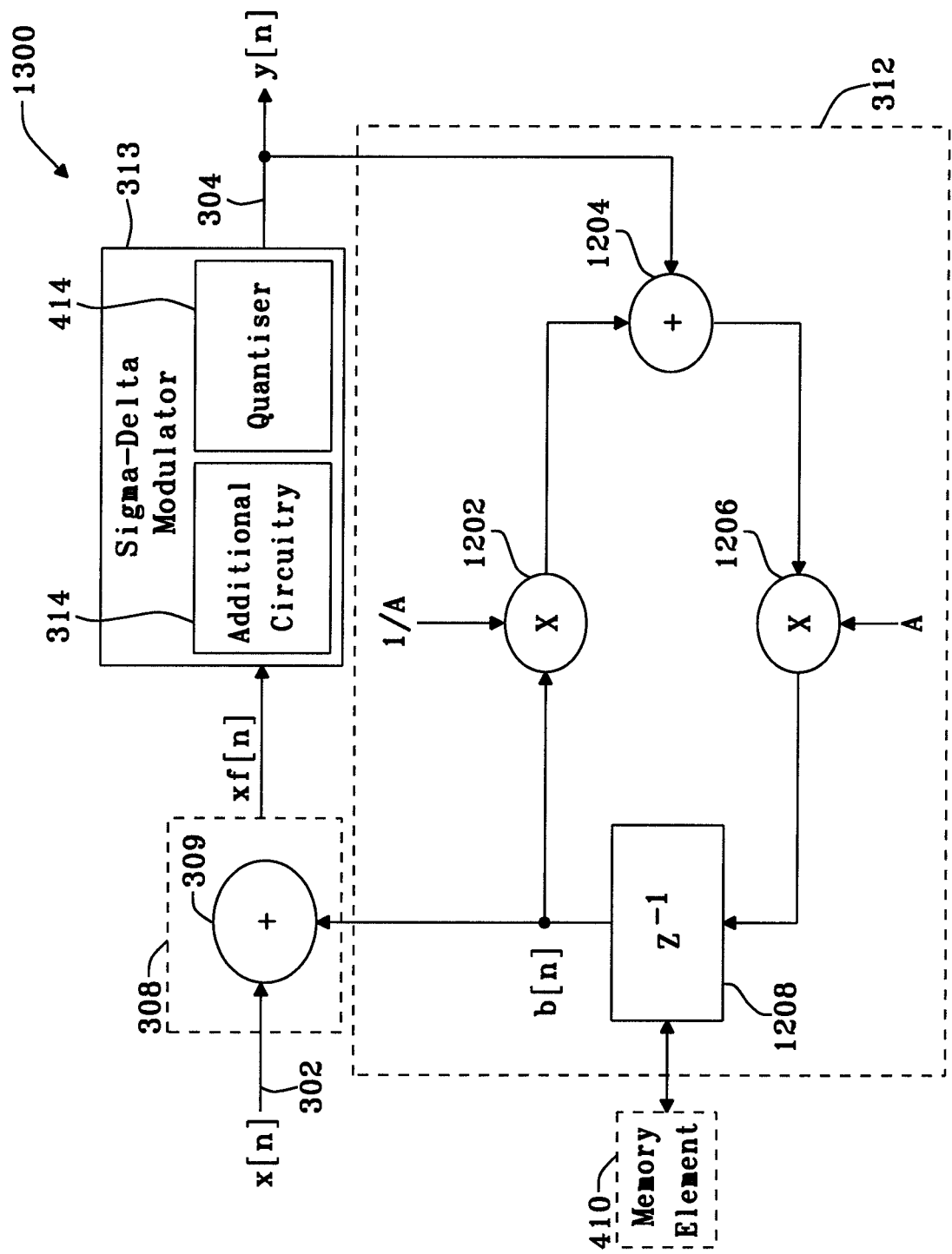
FIG. 11 is a schematic of a digital filter in accordance with a ninth embodiment of the present disclosure.

FIG. 11 is a schematic of a digital filter 1300 in accordance with a ninth embodiment of the present disclosure. The digital filter 1300 corresponds to the digital filter 1200 with the addition of the sigma-delta modulator 313.

The digital filter 1300 comprises the sigma-delta modulator 313 which comprises the quantiser 414. The sigma-delta modulator 313 is configured to receive the filtered input signal xf[n] and to process the filtered input signal xf[n]. Processing of the filtered input signal xf[n] may be carried out prior to and/or after quantisation and generation of the output signal y[n]. This processing may be performed by additional circuitry 314, as shown in FIG. 11, that is positioned in the signal path before the quantiser 414 as shown in FIG. 11, or alternatively after the qunatiser 414 or in parallel with the quantiser 414 in accordance with the understanding of the skilled person.

The sigma-delta modulator 313 may function as described previously, and as described by equations (6) and (7).

The digital filter 1300 may comprise the memory element 410 for storing the first filter variable b[1] and/or the second filter variable b[2]. The memory element 410 may function as described previously in relation to another embodiment.

Figure 12:
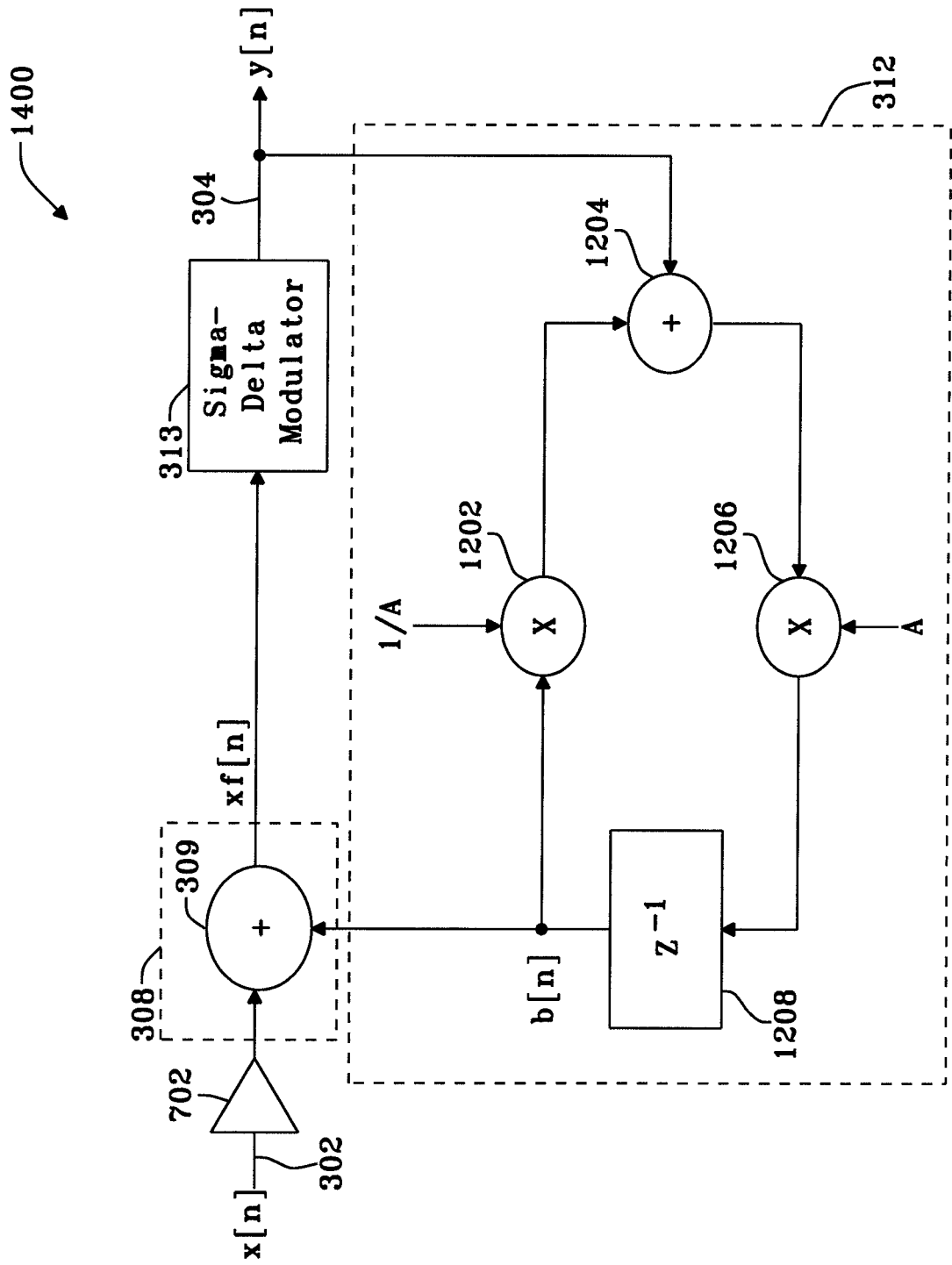
FIG. 12 is a schematic of a digital filter in accordance with a tenth embodiment of the present disclosure.

FIG. 12 is a schematic of a digital filter 1400 in accordance with a tenth embodiment of the present disclosure. The digital filter 1400 corresponds to the digital filter 1300 with the addition of the attenuation circuit 702.

The attenuation circuit 702 is configured to attenuate the input signal 302 prior to the filtered input signal xf[n] being provided. The attenuation circuit 702 may function as described previously in relation to FIG. 5.

Figure 13:
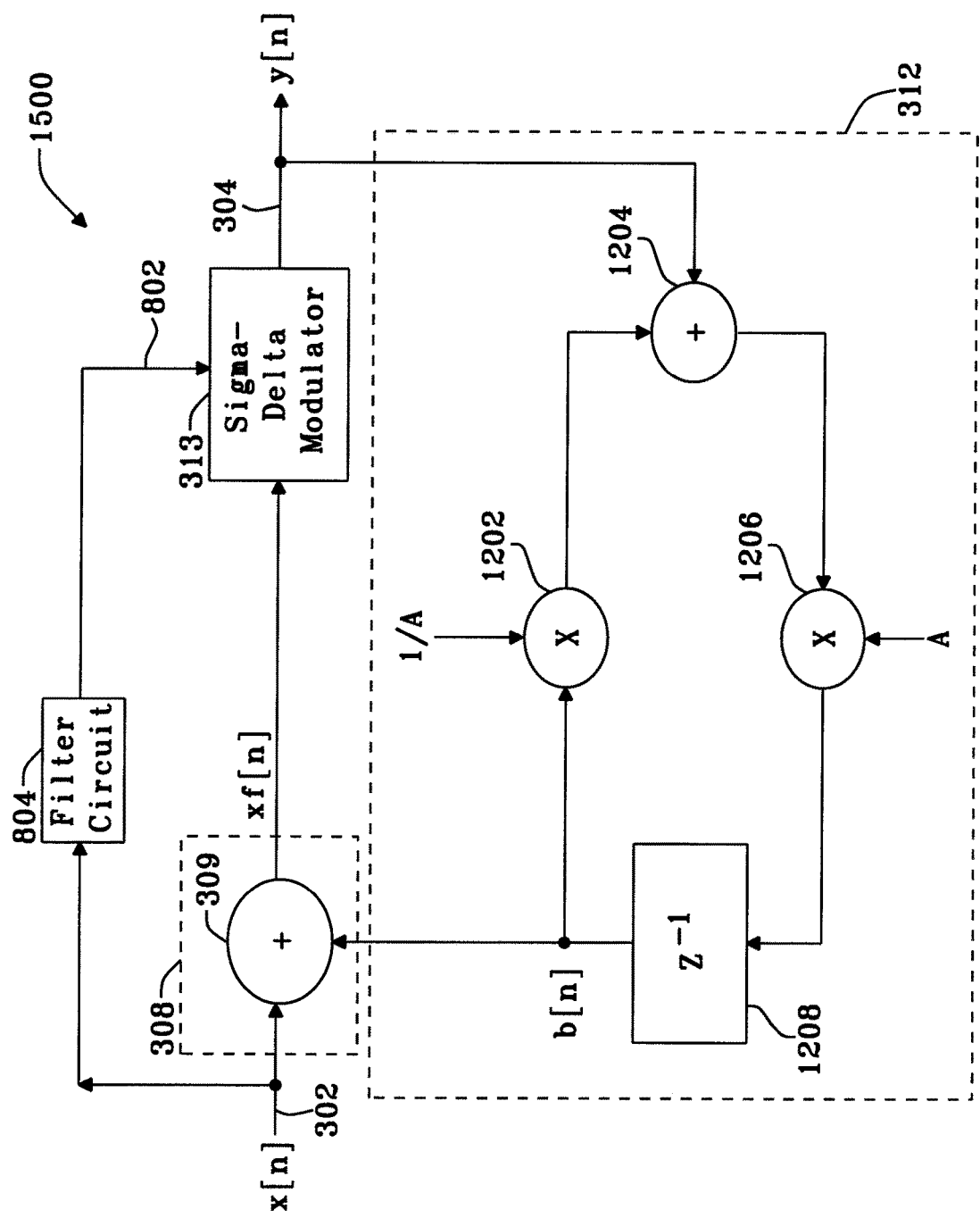
FIG. 13 is a schematic of a digital filter in accordance with an eleventh embodiment of the present disclosure.

FIG. 13 is a schematic of a digital filter 1500 in accordance with an eleventh embodiment of the present disclosure. The sigma-delta modulator 313 is configured to apply a sigma-delta modulator gain to the filtered input signal cf[n] in the generation of the output signal 304. In the present embodiment, the sigma-delta modulator 313 is an adaptive sigma-delta modulator and therefore the sigma-delta modulator gain may be adjusted.

In the present embodiment the sigma-delta modulator 313 is configured to receive the indicator signal 802 that is representative of a magnitude of the input signal 302. In particular the indicator signal 802 may be representative of the magnitude of the input signal 302 at a frequency band of interest which may be the audio band (less than 24 kHz). The sigma-delta modulator gain may be adjusted based on the indicator signal 802.

In the present embodiment, the indicator signal 802 is provided by the filter circuit 804 which is configured to detect the input signal 302 and to provide the indicator signal 802 to the sigma-delta modulator 313. The indicator signal 802 is dependent on the input signal 302.

In the present embodiment, the digital filter 1500 is configured as a high pass filter such that the frequency component to be attenuated in the input signal 302 are low frequency components and the filter circuit 804 is a low pass filter. Therefore the indicator signal 802 is a low passed input signal 302.

It will be appreciated that in further embodiments, the digital filter 1500 may be configured to function as a different type of filter, such as a band pass filter, a band reject filter and a low pass filter, as discussed previously. In such embodiments, the filter circuit 804 may be a low pass filter.

In a further embodiment, the filter circuit 804 may be an external component to the digital filter 1500, for example as described in relation to FIG. 7.

In a further embodiment, the filter circuit 804 may be configured to run an algorithm to determine a suitable sigma-delta modulator gain based on the magnitude of the input signal 302 at the one or more frequency components to be attenuated as estimated using the input signal 302, for example as described in relation to FIG. 8. The indicator signal 802 may be based on the sigma-delta modulator gain determined by the algorithm.

Figure 14:
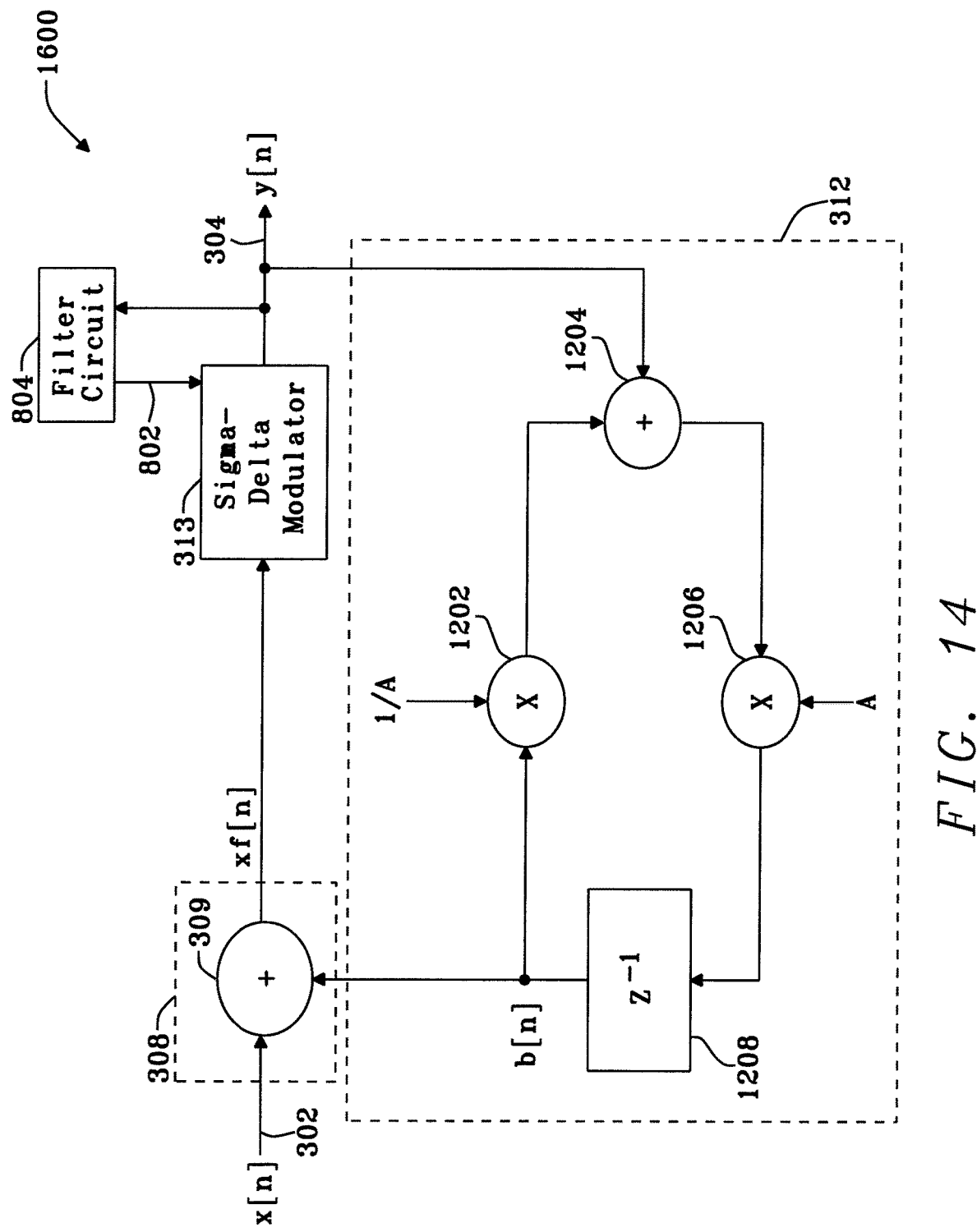
FIG. 14 is a schematic of a digital filter in accordance with twelfth embodiment of the present disclosure.

FIG. 14 is a schematic of a digital filter 1600 in accordance with twelfth embodiment of the present disclosure. The operation of the digital filter 1600 may be understood with reference to FIG. 9 and its accompanying description.

The digital filters described herein may be used for low-latency filtering rather than an analogue filter, thereby reducing external and/or internal passive components in a physical implementation of a system.

Various improvements and modifications may be made to the above without departing from the scope of the disclosure.

What is claimed is:

1. A digital filter comprising:
a) a first filter circuit configured to:
   i) receive an input signal comprising input values at successive time steps which include a first input value at a first time step and a second input value at a second time step; and
   ii) provide a filtered input signal comprising filtered values at successive time steps which include a first filtered value at the first time step and a second filtered value at a second time step, the first filtered value being provided by applying a first filter variable to the first input value and the second filtered value being provided by applying a second filter variable to the second input value;
b) a quantizer configured to provide an output signal comprising output values at successive time steps which include a first output value at the first time step and a second output value at the second time step, the output signal being provided by quantising the filtered input signal; and
c) a filter variable circuit comprising:
   i) a first multiplication circuit configured to:
      receive the first filter variable; and
      divide the first filter variable by a first gain factor;
   ii) a first summing circuit configured to:
      receive the divided first filter variable;
      receive the output signal; and
      add the divided first filter variable and the first output value
   iii) a second multiplication circuit configured to:
      receive the sum of the divided first filter variable and the first output value; and
      multiply the sum of the divided first filter variable and the first output value by the first gain factor;
   iv) a delay circuit configured to:
      receive the sum of the divided first filter variable and the first output value multiplied by the first gain factor; and
      provide the second filter variable to the first filter circuit, the second filter variable being equal to the sum of the divided first filter variable and the first output value multiplied by the first gain factor;
   wherein:
   the first filter variable and the second filter variable are representative of one or more frequency components to be attenuated in the input signal.

2. The digital filter of claim 1, wherein the first filter circuit comprises a second summing circuit configured to:
receive the input signal, the first filter variable and the second filter variable;
provide the first filtered value by subtracting the first filter variable from the first input value; and
provide the second filtered value by subtracting the second filter variable from the second input value.

3. The digital filter of claim 1, wherein the first gain factor is a power of two.

4. The digital filter of claim 1, comprising a memory element for storing the first filter variable and/or the second filter variable.

5. The digital filter of claim 1, wherein the first filter variable is a user defined value.

6. The digital filter of claim 1, wherein the input signal comprises two or more levels of quantisation and/or the output signal comprises two or more levels of quantisation.

7. The digital filter of claim 1, wherein the digital filter is configured as one of:
a high pass filter such that the frequency components to be attenuated in the input signal are low frequency components;

a low pass filter such that the frequency components to be attenuated in the input signal are high frequency components;

a band reject filter such that the frequency components to be attenuated in the input signal are over a finite frequency band; and a band pass filter such that the frequency components to be attenuated in the input signal are high and low frequency components either side of a frequency band to be passed.

8. The digital filter of claim 1, comprising a sigma-delta modulator comprising the quantiser, the sigma-delta modulator being configured to receive the filtered input signal and to process the filtered input signal before and/or after being quantised by the quantiser.

9. The digital filter of claim 8, comprising an attenuation circuit configured to attenuate the input signal prior to the filtered input signal being provided.

10. The digital filter of claim 8, wherein the sigma-delta modulator is configured to apply a sigma-delta modulator gain to the filtered input signal in the generation of the output signal.

11. The digital filter of claim 10, wherein:
the sigma-delta modulator is configured to:
  i) receive an indicator signal that is representative of a magnitude of the input signal; and
  ii) adjust the sigma-delta modulator gain based on the indicator signal.

12. The digital filter of claim 11, wherein the sigma-delta modulator is configured to receive the indicator signal from a second filter circuit that is configured to:
  detect a first signal, the first signal being one of the input signal and the output signal; and
  provide the indicator signal to the sigma-delta modulator; wherein:
  the indicator signal is dependent on the first signal.

13. The digital filter of claim 12, comprising the second filter circuit.

14. The digital filter of claim 12, wherein the second filter circuit is configured to:
  run an algorithm to determine a suitable sigma-delta modulator gain based on the magnitude of the input signal at the one or more frequency components to be attenuated as estimated using the first signal; wherein:
  the indicator signal is based on the sigma-delta modulator gain determined by the algorithm.

15. The digital filter of claim 12, wherein:
the second filter circuit is a low pass filter, such that the indicator signal is a low passed first signal.

16. The digital circuit of claim 1, wherein the first filter variable and the second filter variable are an estimates of the one or more frequency components to be attenuated in the input signal.

17. A method of digital filtering an input signal to provide an output signal, the method comprising:
  receiving the input signal comprising input values at successive time steps which include a first input value at a first time step and a second input value at a second time step using a first filter circuit;
  providing a filtered input signal comprising filtered values at successive time steps which include a first filtered value at the first time step and a second filtered value at a second time step, the first filtered value being provided by applying a first filter variable to the first input value and the second filtered value being provided by applying a second filter variable to the second input value using the first filter circuit;
  providing an output signal comprising output values at successive time steps which include a first output value at the first time step and a second output value at the second time step, the output signal being provided by quantising the filtered input signal using a quantizer;
  receiving the first filter variable using a first multiplication circuit;
  dividing the first filter variable by a first gain factor using the first multiplication circuit;
  receiving the divided first filter variable using a first summing circuit;
  receiving the output signal using the first summing circuit;
  adding the divided first filter variable and the first output value using the first summing circuit;
  receiving the sum of the divided first filter variable and the first output value using a second multiplication circuit;
  multiplying the sum of the divided first filter variable and the first output value by the first gain factor using the second multiplication circuit;
  receiving the sum of the divided first filter variable and the first output value multiplied by the first gain factor using a delay circuit; and
  providing the second filter variable to the first filter circuit using the delay circuit, the second filter variable being equal to the sum of the divided first filter variable and the first output value multiplied by the first gain factor;
  wherein:
  the first filter variable and the second filter variable are representative of one or more frequency components to be attenuated in the input signal.

18. The method of claim 17, wherein the first filter circuit comprises a second summing circuit, the method comprising:
  receiving the input signal, the first filter variable and the second filter variable using the second summing circuit;
  providing the first filtered value by subtracting the first filter variable from the first input value using the second summing circuit; and
  providing the second filtered value by subtracting the second filter variable from the second input value using the second summing circuit.

19. The method of claim 17, wherein the first gain factor is a power of two.

20. The method of claim 17, comprising storing the first filter variable and/or the second filter variable using a memory element.

* * * * *